United States Patent
Leobandung

(10) Patent No.: US 9,825,143 B1
(45) Date of Patent: Nov. 21, 2017

(54) SINGLE SPACER TUNNEL ON STACK NANOWIRE

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/401,684

(22) Filed: Jan. 9, 2017

(51) Int. Cl.
  H01L 21/00 (2006.01)
  H01L 21/84 (2006.01)
  H01L 29/423 (2006.01)
  H01L 29/78 (2006.01)
  H01L 29/06 (2006.01)
  H01L 29/66 (2006.01)
  H01L 29/10 (2006.01)

(52) U.S. Cl.
  CPC .... *H01L 29/42392* (2013.01); *H01L 29/0673* (2013.01); *H01L 29/1033* (2013.01); *H01L 29/6653* (2013.01); *H01L 29/6681* (2013.01); *H01L 29/66545* (2013.01); *H01L 29/66553* (2013.01); *H01L 29/7853* (2013.01)

(58) Field of Classification Search
  CPC ........... H01L 29/0673; H01L 29/42392; H01L 29/66545; H01L 29/0669; H01L 29/1033
  See application file for complete search history.

(56) References Cited

U.S. PATENT DOCUMENTS

| | | | | |
|---|---|---|---|---|
| 7,416,993 B2* | 8/2008 | Segal | ..................... | B82Y 10/00 438/742 |
| 7,585,716 B2* | 9/2009 | Cheng | .............. | H01L 29/42368 257/E21.453 |
| 7,892,945 B2* | 2/2011 | Bedell | .................... | B82Y 10/00 438/445 |
| 8,084,308 B2* | 12/2011 | Chang | ................. | H01L 27/1203 257/24 |
| 8,216,902 B2* | 7/2012 | Chang | .................... | B82Y 10/00 257/E21.645 |
| 8,541,274 B1* | 9/2013 | Xie | ....................... | H01L 21/845 257/E21.635 |
| 8,969,149 B2 | 3/2015 | Leobandung | | |
| 2013/0270512 A1* | 10/2013 | Radosavljevic | | H01L 21/823807 257/9 |

\* cited by examiner

*Primary Examiner* — Zandra Smith
*Assistant Examiner* — John M Parker
(74) *Attorney, Agent, or Firm* — Scully, Scott, Murphy & Presser, P.C.; Louis J. Percello, Esq.

(57) ABSTRACT

A method for forming a stacked semiconductor nanowire field effect transistor (FET) having reduced parasitic capacitance is provided. The parasitic capacitance of the stacked semiconductor nanowire FET including vertically stacked and vertically spaced apart semiconductor nanowires can be reduced by forming a tunnel spacer laterally surrounding a gate structure located beneath each of the vertically stacked and vertically spaced apart semiconductor nanowires.

20 Claims, 24 Drawing Sheets

SINGLE SPACER TUNNEL ON STACK NANOWIRE

BACKGROUND

The present application relates to a method of forming a semiconductor structure. More particularly, the present application relates to a method of forming a semiconductor nanowire field effect transistor with reduced parasitic capacitance.

The use of non-planar semiconductor devices such as, for example, fin field effect transistors (FinFETs) and semiconductor nanowire FETs is the next step in the evolution of complementary metal oxide semiconductor (CMOS) devices. A semiconductor nanowire with a partially or a totally surrounding gate is one ideal architecture for off-current reduction in sub-45 nm technologies. A gate-all semiconductor nanowire configuration enables to relax channel film thickness requirements for a target leakage control. Stacked semiconductor nanowires yield very high current levels per layout surface area overcoming the current limit imposed by a small width to pitch ratio. Despite providing very high current levels, prior art stacked semiconductor nanowires have a high parasitic capacitance associated therewith.

SUMMARY

The present application provides a method for forming a stacked semiconductor nanowire FET having reduced parasitic capacitance. The parasitic capacitance of the stacked semiconductor nanowire FET including vertically stacked and vertically spaced apart semiconductor nanowires can be reduced by forming a tunnel spacer laterally surrounding a gate structure located beneath each of the vertically stacked and vertically spaced apart semiconductor nanowires.

In one aspect of the present application, a method of forming a semiconductor structure having reduced parasitic capacitance is provided. The method of the present application includes forming at least one multilayered stacked semiconductor material structure on a semiconductor substrate. The at least one multilayered stacked semiconductor material structure includes alternating layers of a sacrificial semiconductor material and a semiconductor nanowire template material. The sacrificial semiconductor material is a different semiconductor material than the semiconductor nanowire template material. After forming at least one sacrificial gate material structure straddling a portion of the at least one multilayered stacked semiconductor structure, portions of each layer of sacrificial semiconductor material that are not covered by the at least one sacrificial gate material structure is removed. Simultaneously a first spacer is formed on each sidewall of the at least one sacrificial gate material structure and a second spacer is formed within an area previously occupied by each exposed portion of each layer of sacrificial semiconductor material. Next, portions of each layer of semiconductor nanowire template material and each second spacer that are not covered by the at least one sacrificial gate structure and each first gate pacer are removed. A source region and a drain region are then formed from exposed sidewall surfaces of a remaining portion of each layer of semiconductor nanowire template material and on opposite sides of the at least one sacrificial gate material structure. Next, the remaining portion of each layer of semiconductor nanowire template material is suspended by removing the at least one sacrificial gate material structure and a remaining portion of each layer of sacrificial semiconductor material. Next, a first gate structure is formed within an area previously occupied by the at least one sacrificial gate material structure and a second gate structure is formed within an area previously occupied by each remaining portion of each layer of sacrificial semiconductor material.

DETAILED DESCRIPTION

Figure 1A:
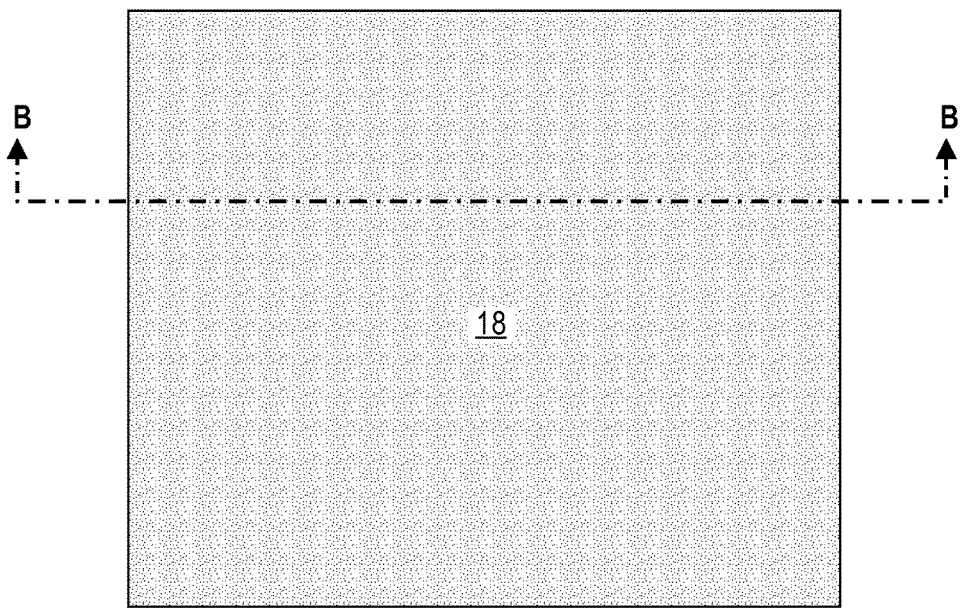
FIG. 1A is a top-down view of an initial structure containing a semiconductor substrate having a base sacrificial semiconductor layer located on a surface of the semiconductor substrate, and a semiconductor material stack located on the base sacrificial semiconductor layer and comprising alternating sacrificial semiconductor material layers and semiconductor nanowire template material layers that can be employed in one embodiment of the present application.

The present application, which provides a method of forming a semiconductor nanowire field effect transistor will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

In current semiconductor nanowire device manufacturing, stacked semiconductor nanowires can be used to generate high current for CMOS devices. Current techniques used to form stacked semiconductor nanowires include providing a semiconductor material stack including sequentially formed SiGe release layers and semiconductor material layers. During the formation of the stacked semiconductor nanowires, the various SiGe release layers are removed from the semiconductor material stack forming stacked semiconductor nanowires comprising the semiconductor material layers. Such stacked semiconductor nanowires have a high parasitic capacitance associated therewith. The present application provides a method of forming a semiconductor structure including stacked semiconductor nanowires in which a tunnel spacer laterally surrounds a gate structure located beneath each of the semiconductor nanowires. The tunnel spacer separates the gate structure from source/drain regions of the structure, thus the gate-to-source/drain parasitic capacitance can be reduced.

Figure 1B:
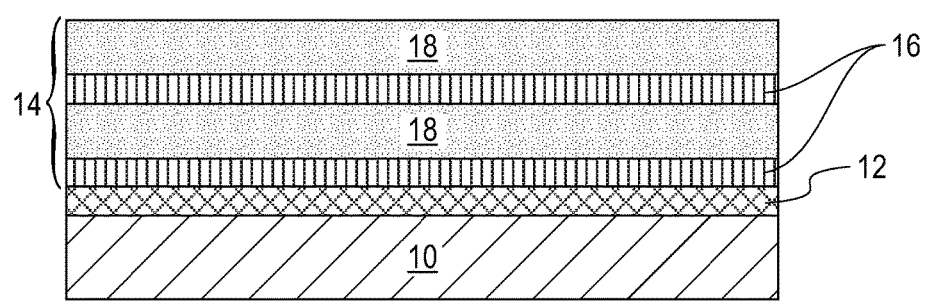
FIG. 1B is a vertical cross sectional through line A-A shown in FIG. 1A.
Figure 2A:
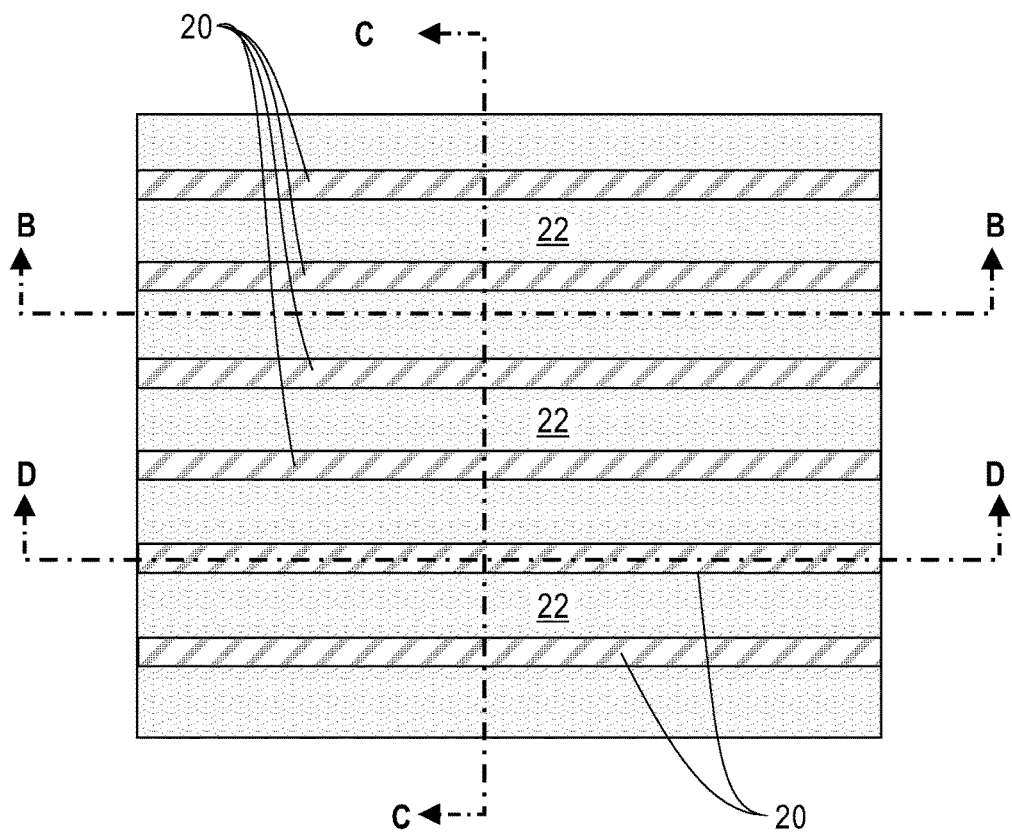
FIG. 2A is a top-down view of the structure shown in FIG. 1A after forming at least one multilayered stacked semiconductor material structure which includes a base sacrificial semiconductor portion, and alternating sacrificial semiconductor material portions and semiconductor nanowire template material portions, and forming trench isolation structures.
Figure 2B:
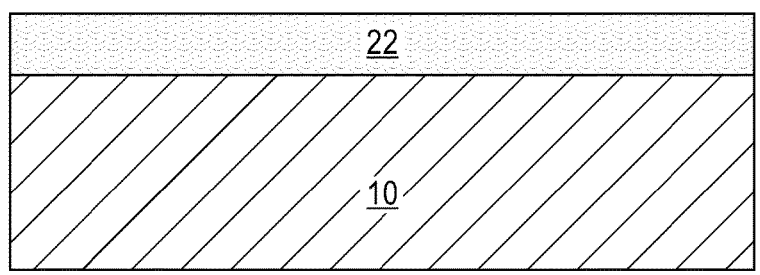
FIG. 2B is a vertical cross sectional through line A-A shown in FIG. 2A.
Figure 2C:
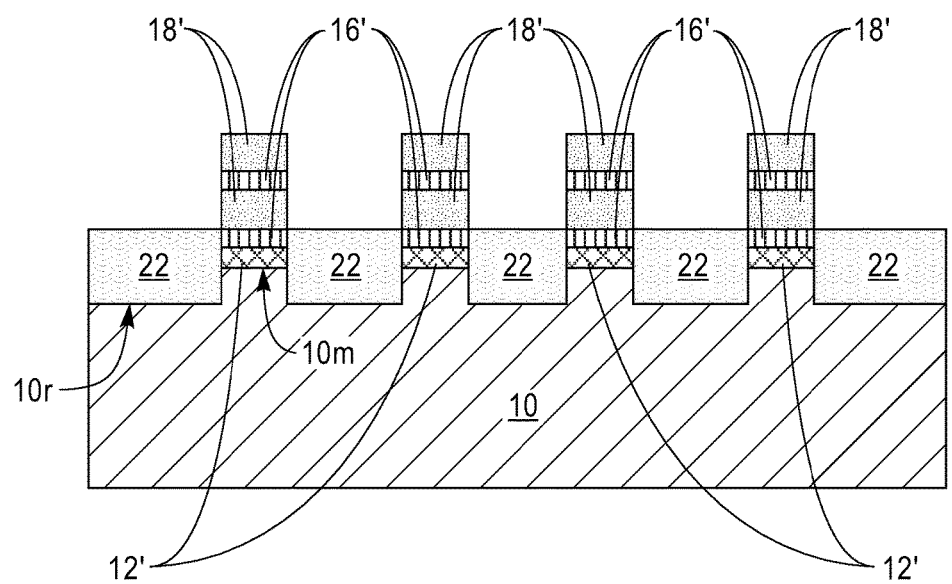
FIG. 2C is a vertical cross sectional view through line B-B shown in FIG. 2A.
Figure 2D:
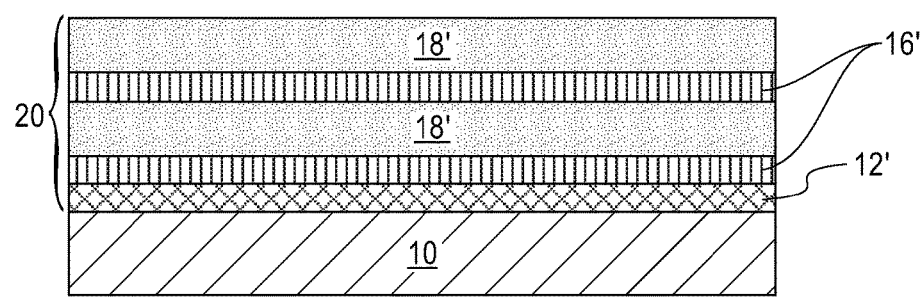
FIG. 2D is a vertical cross sectional view through line C-C shown in FIG. 2A.
Figure 3A:
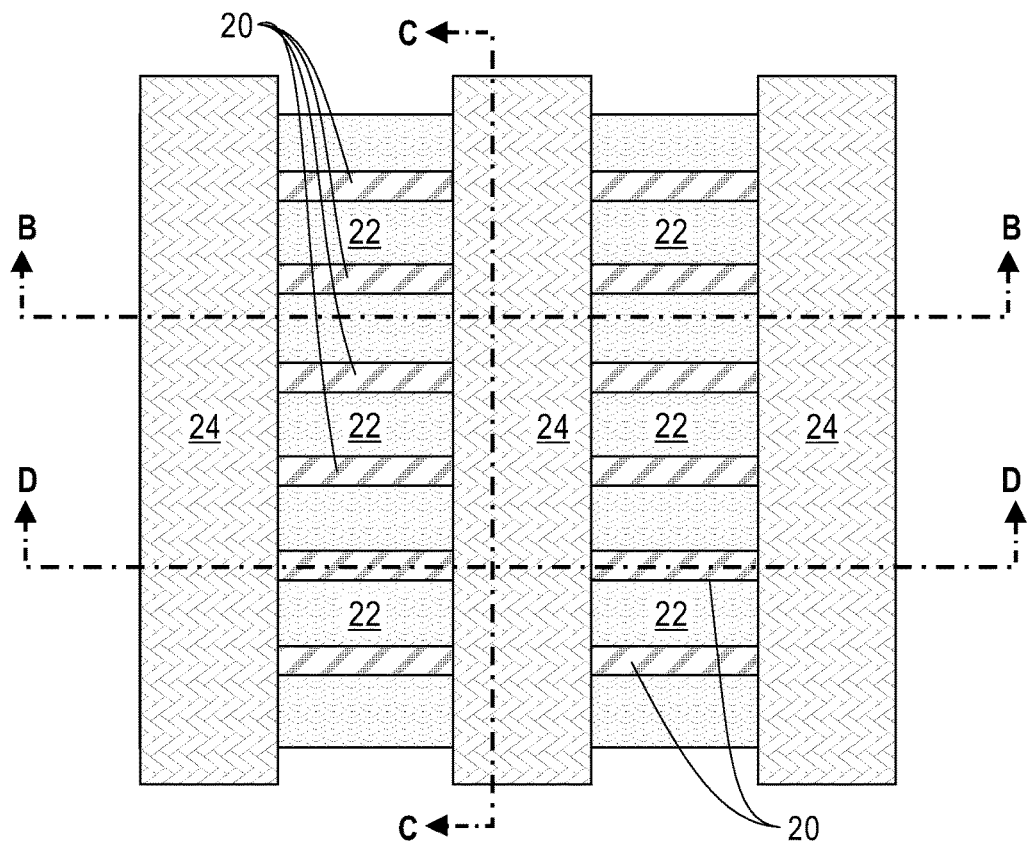
FIG. 3A is a top-down view of the structure shown in FIG. 2A after forming at least one sacrificial gate material structure on exposed portions of each trench isolation structure and straddling each multilayered stacked semiconductor material structure.
Figure 3B:
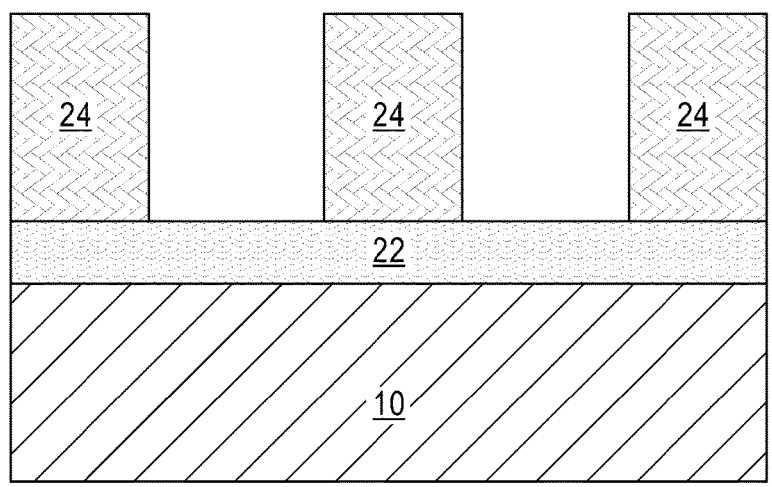
FIG. 3B is a vertical cross sectional through line A-A shown in FIG. 3A.
Figure 3C:
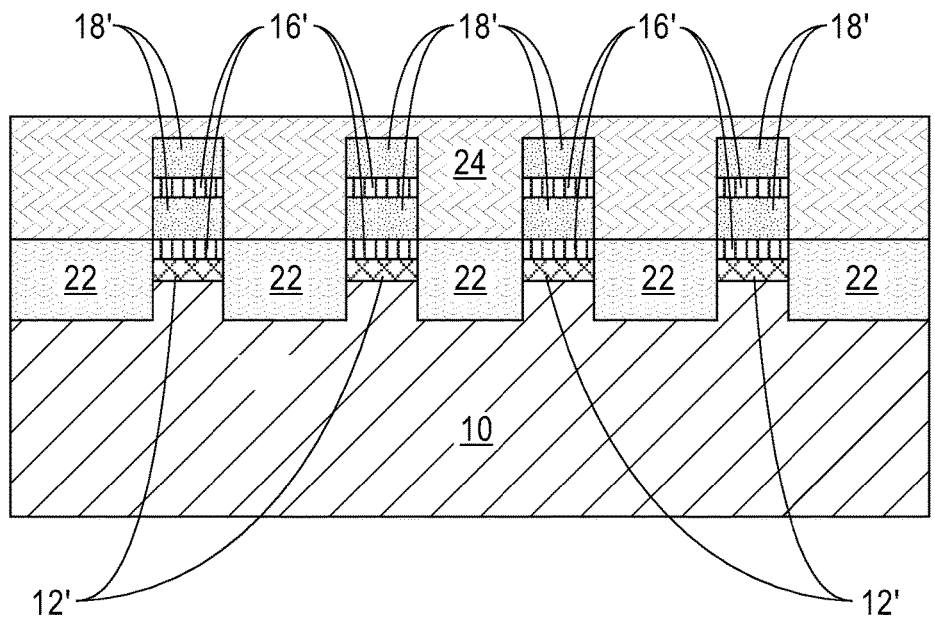
FIG. 3C is a vertical cross sectional view through line B-B shown in FIG. 3A.
Figure 3D:
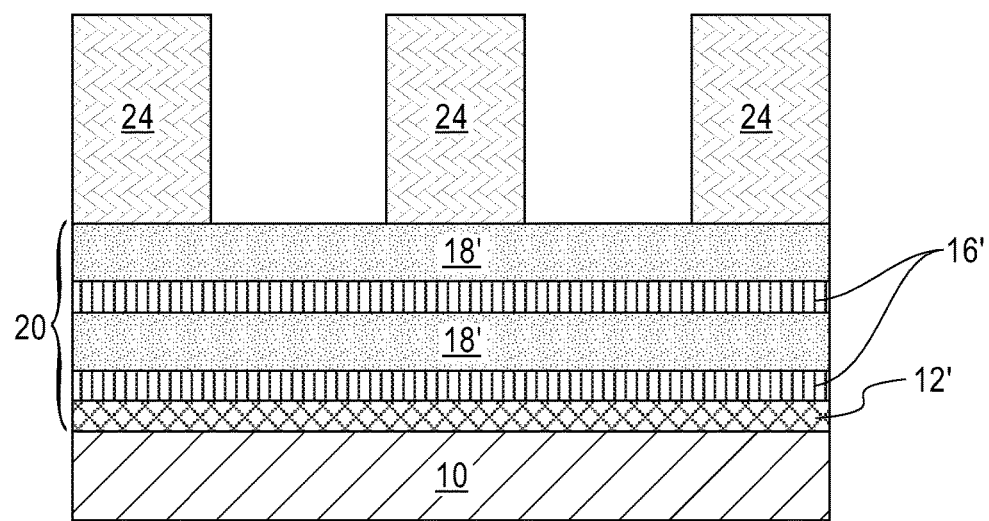
FIG. 3D is a vertical cross sectional view through line C-C shown in FIG. 3A.
Figure 4A:
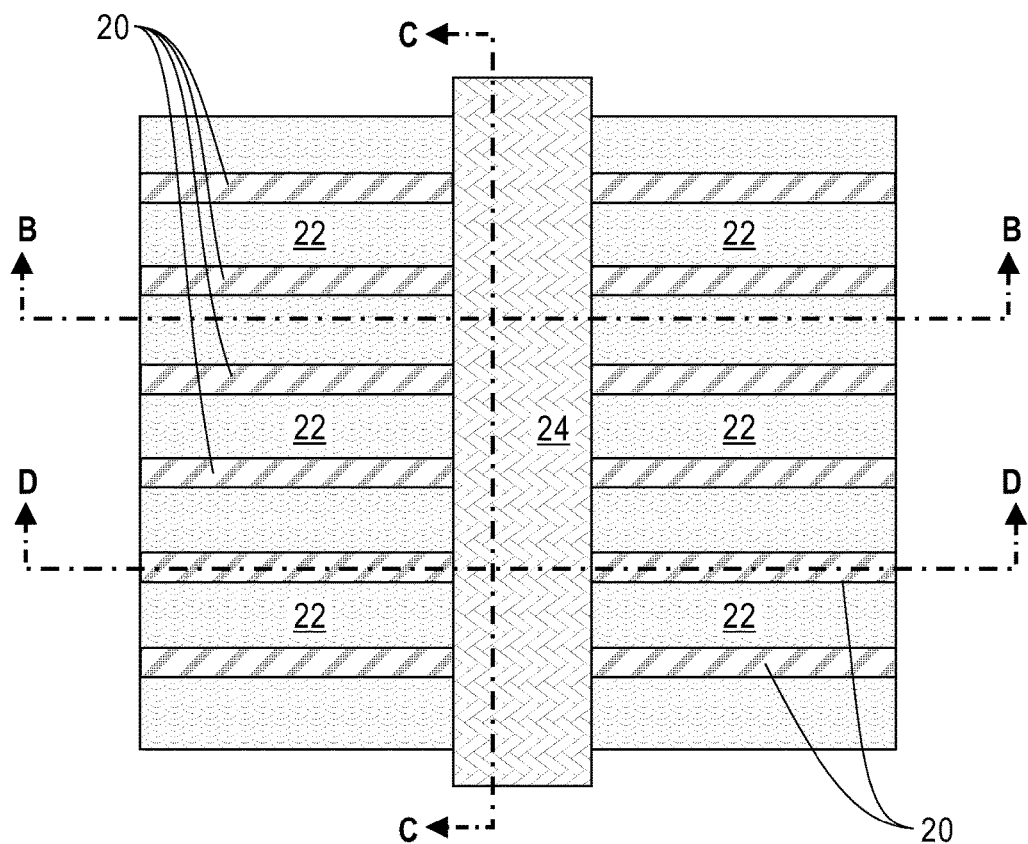
FIG. 4A is a top-down view of the structure shown in FIG. 3A after removing exposed portions of the sacrificial semiconductor material portions that are not covered by the at least one sacrificial gate material structure from each multilayered stacked semiconductor material structure.
Figure 4B:
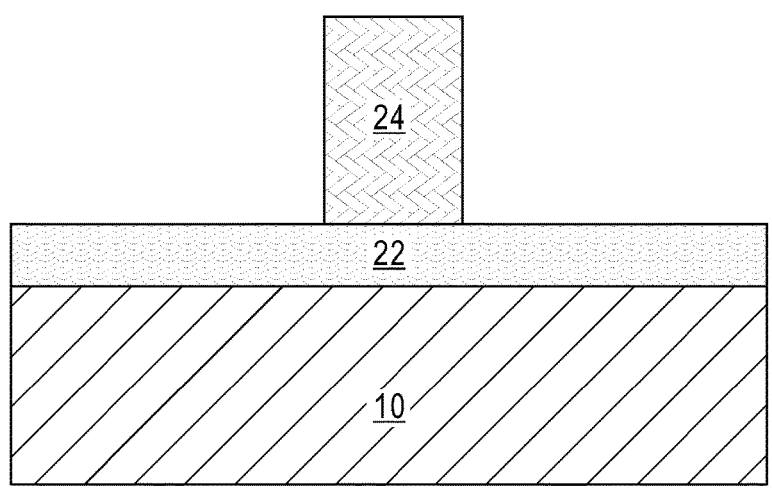
FIG. 4B is a vertical cross sectional through line A-A shown in FIG. 4A.
Figure 4C:
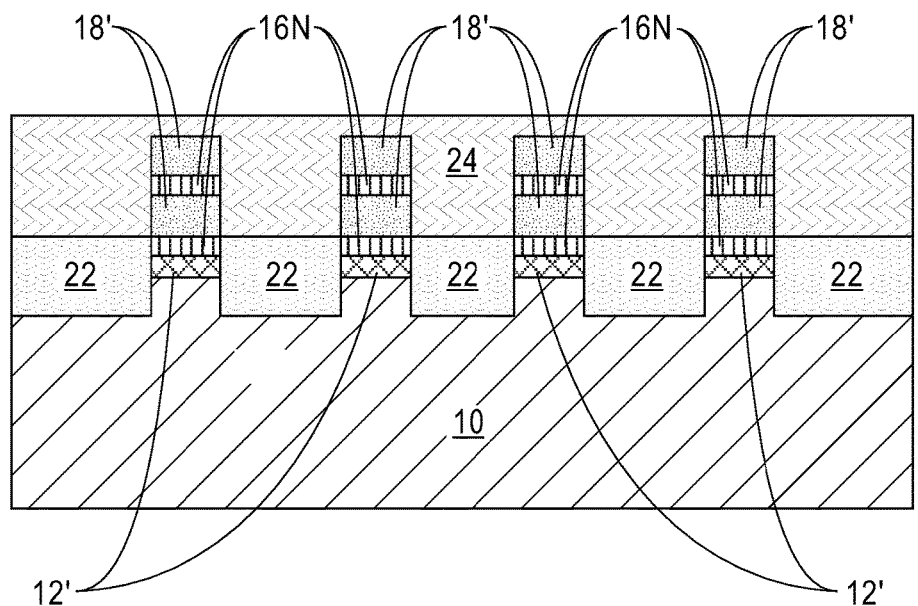
FIG. 4C is a vertical cross sectional view through line B-B shown in FIG. 4A.
Figure 4D:
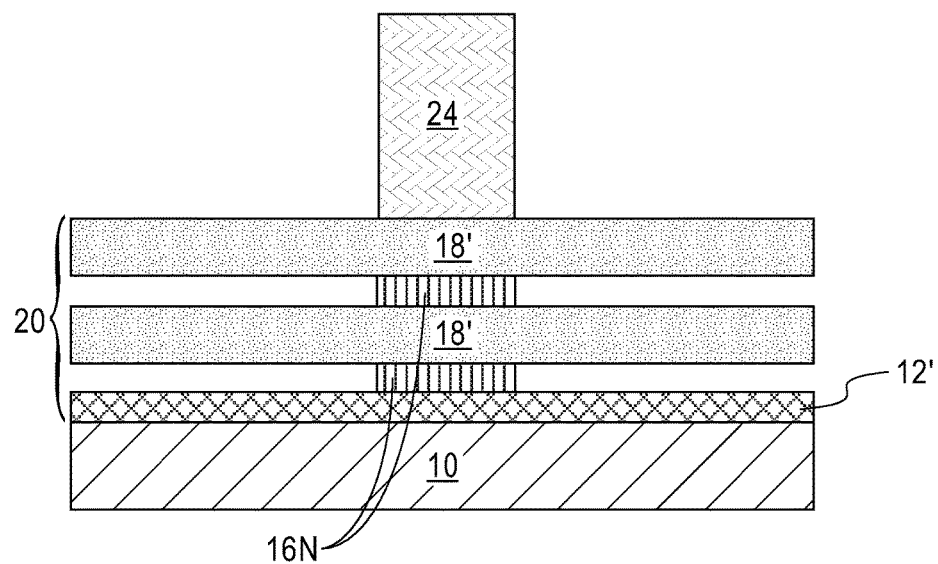
FIG. 4D is a vertical cross sectional view through line C-C shown in FIG. 4A.
Figure 5A:
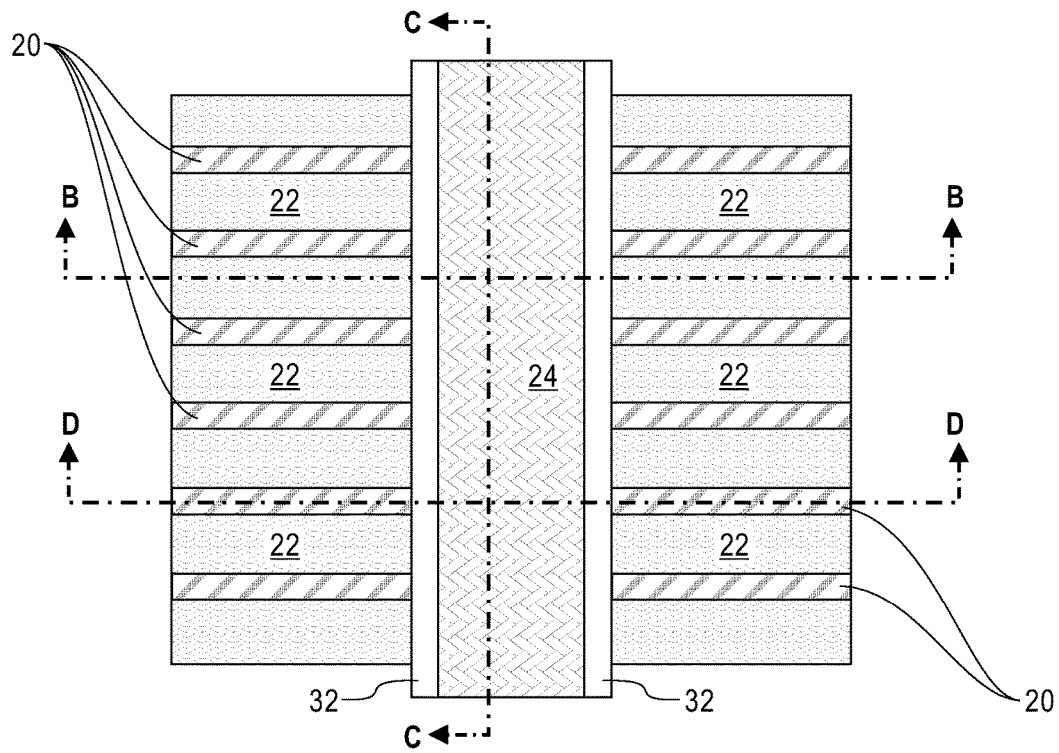
FIG. 5A is a top-down view of the structure shown in FIG. 4A after forming a first spacer on each exposed sidewall surface of the at least one sacrificial gate material structure and a second spacer within an area previously occupied by each exposed portion of each sacrificial semiconductor material portion.
Figure 5B:
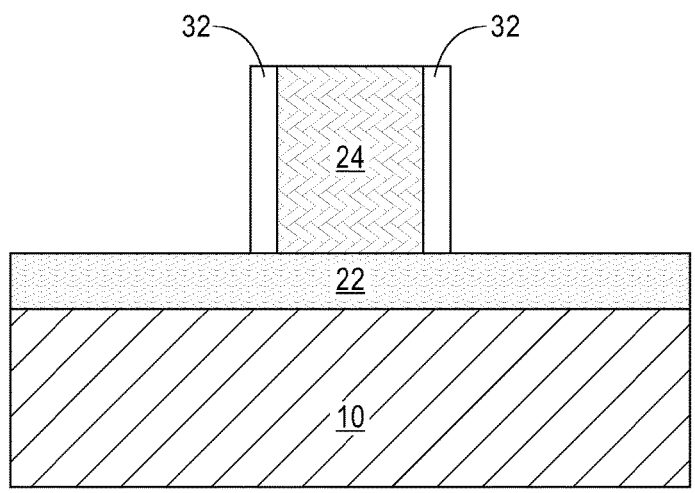
FIG. 5B is a vertical cross sectional through line A-A shown in FIG. 5A.
Figure 5C:
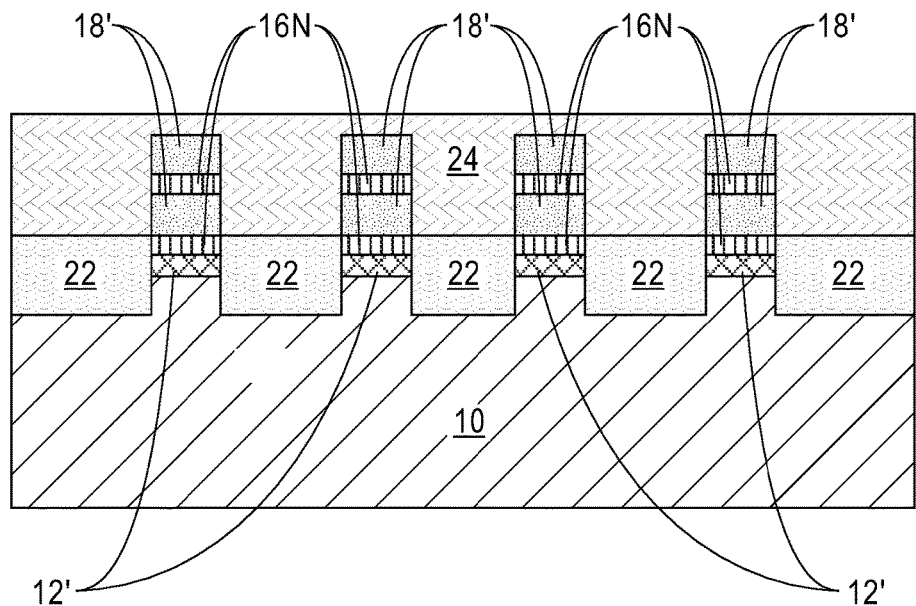
FIG. 5C is a vertical cross sectional view through line B-B shown in FIG. 5A.
Figure 5D:
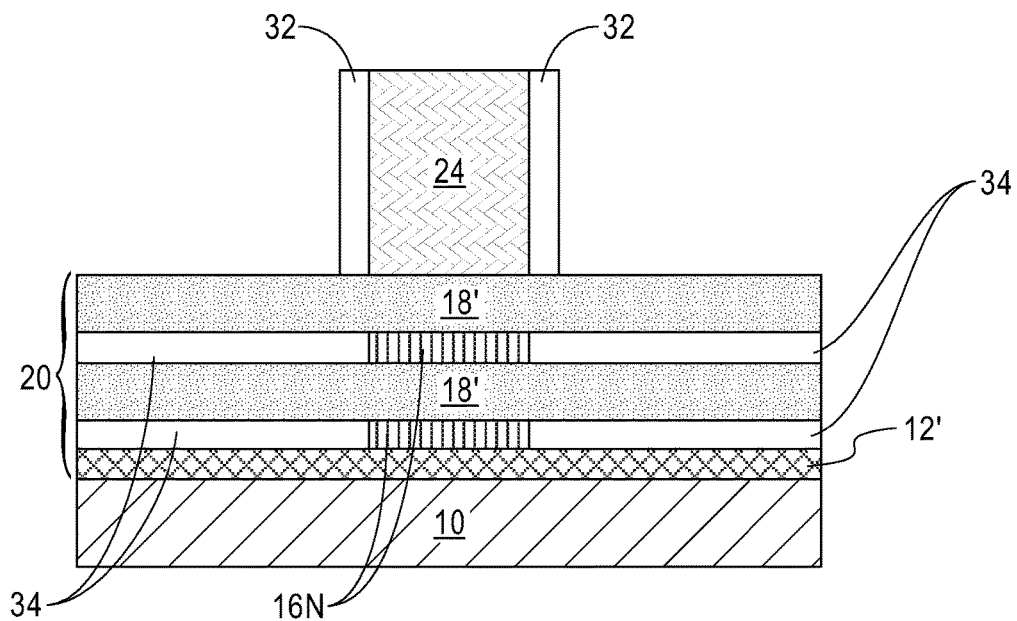
FIG. 5D is a vertical cross sectional view through line C-C shown in FIG. 5A.
Figure 6A:
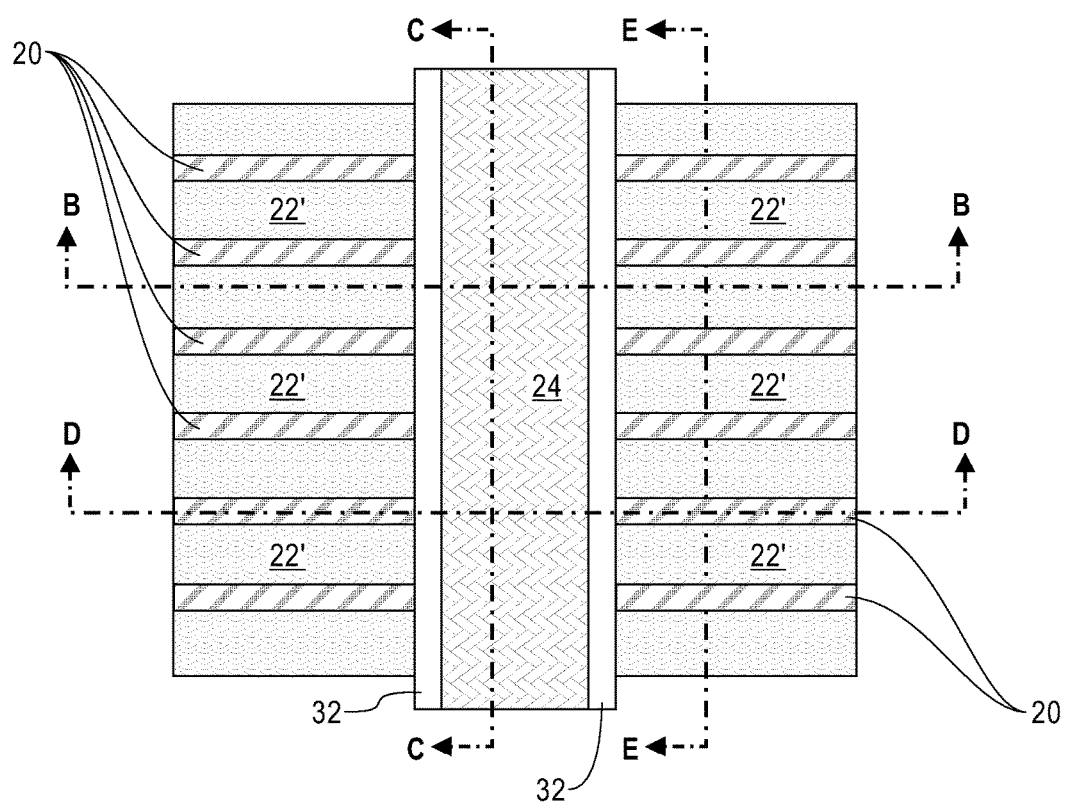
FIG. 6A is a top-down view of the structure shown in FIG. 5A after recessing each trench isolation structure below a bottommost surface of the base sacrificial semiconductor portion of each multilayered stacked semiconductor material structure.
Figure 6B:
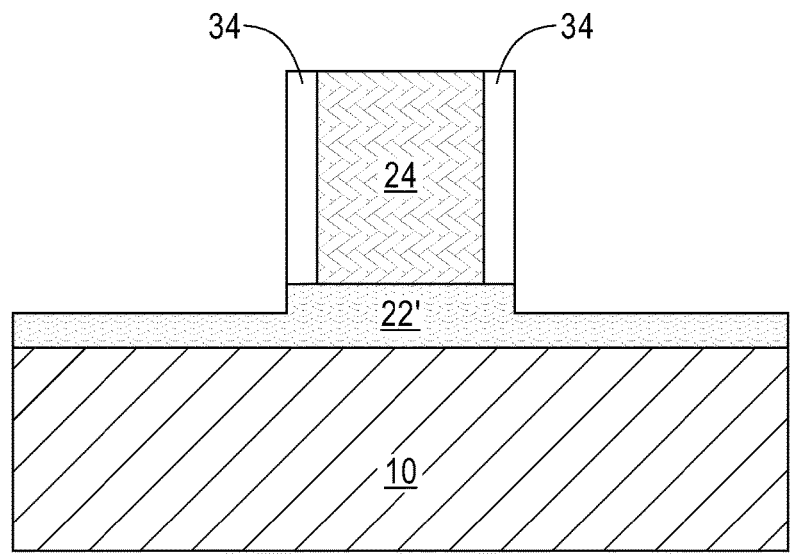
FIG. 6B is a vertical cross sectional through line A-A shown in FIG. 6A.
Figure 6C:
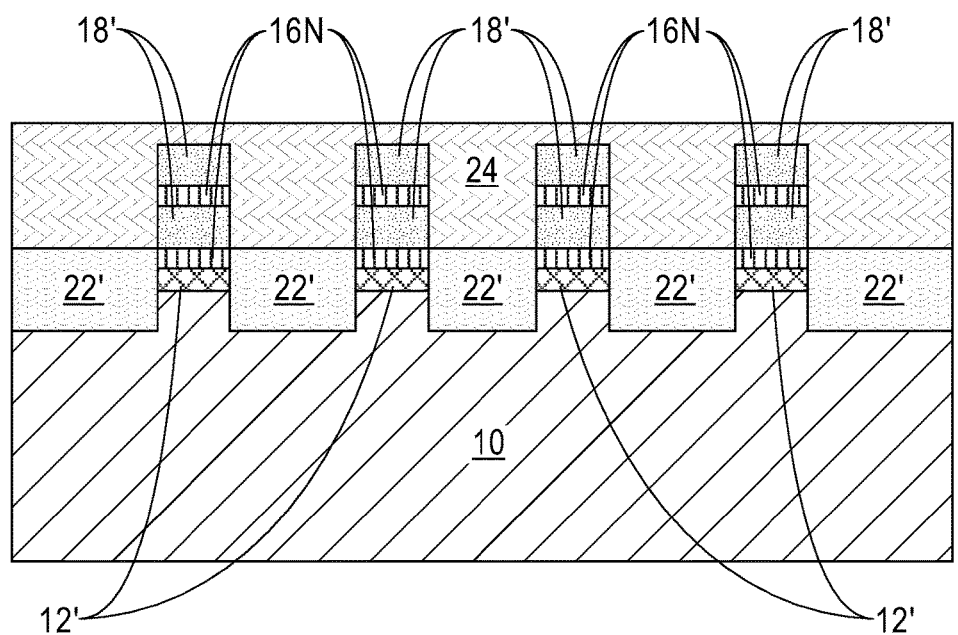
FIG. 6C is a vertical cross sectional view through line B-B shown in FIG. 6A.
Figure 6D:
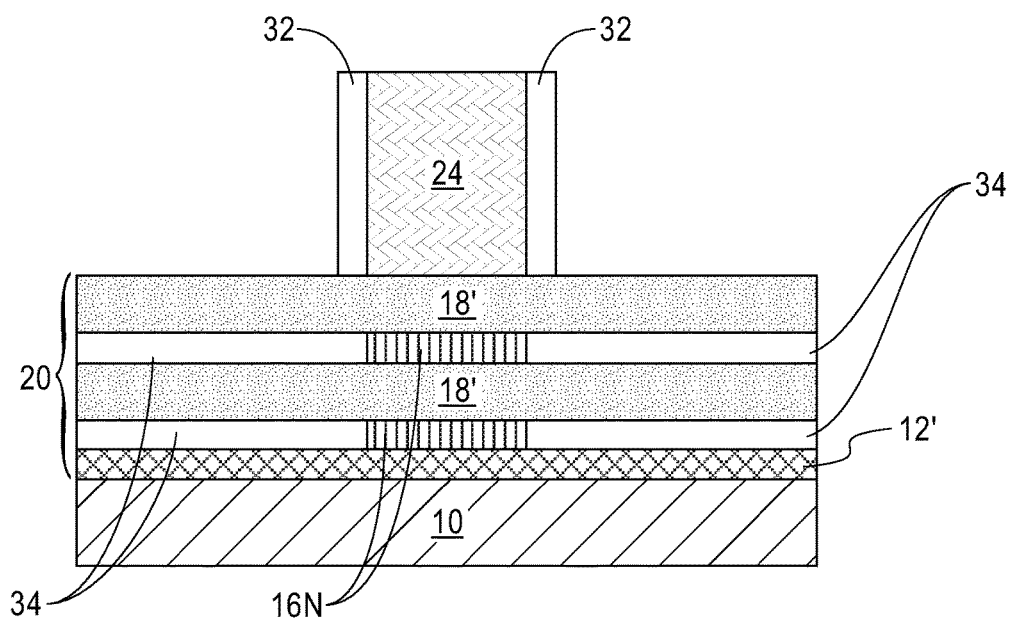
FIG. 6D is a vertical cross sectional view through line C-C shown in FIG. 6A.
Figure 6E:
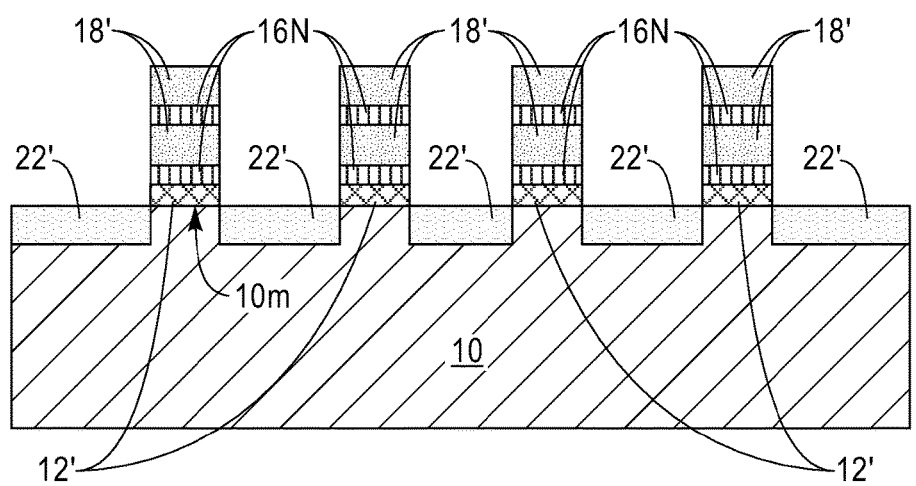
FIG. 6E is a vertical cross sectional view through line D-D shown in FIG. 6A.
Figure 7A:
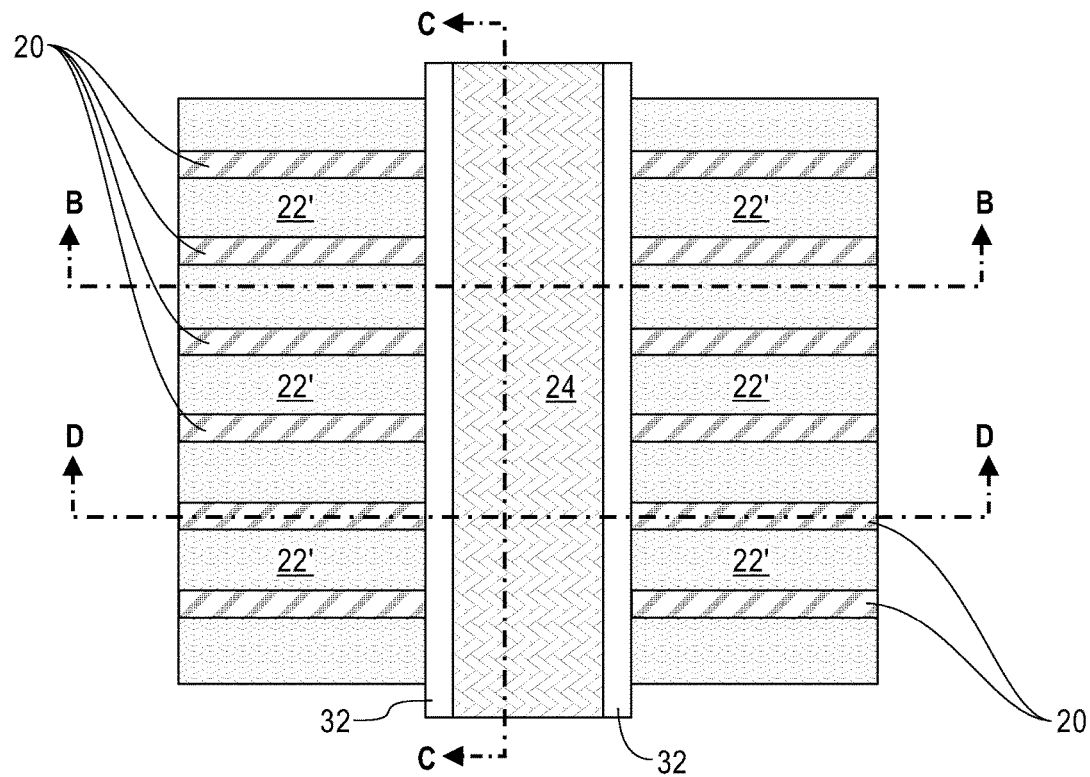
FIG. 7A is a top-down view of the structure shown in FIG. 6A after removing an entirety of the base sacrificial semiconductor portion from each multilayered stacked semiconductor material structure.
Figure 7B:
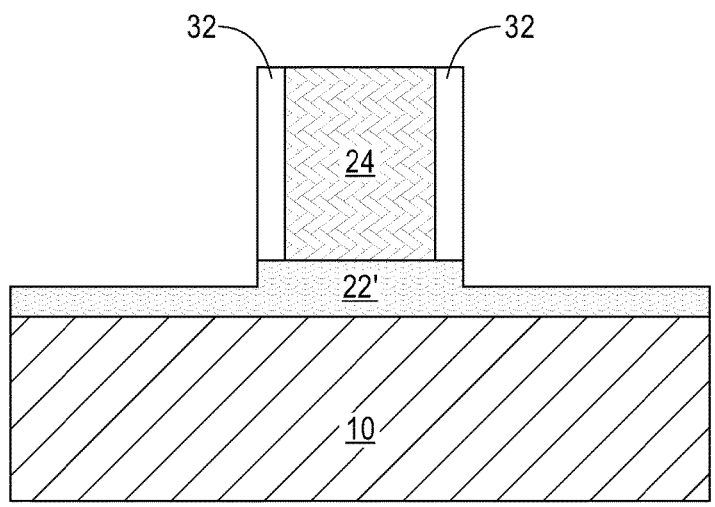
FIG. 7B is a vertical cross sectional through line A-A shown in FIG. 7A.
Figure 7C:
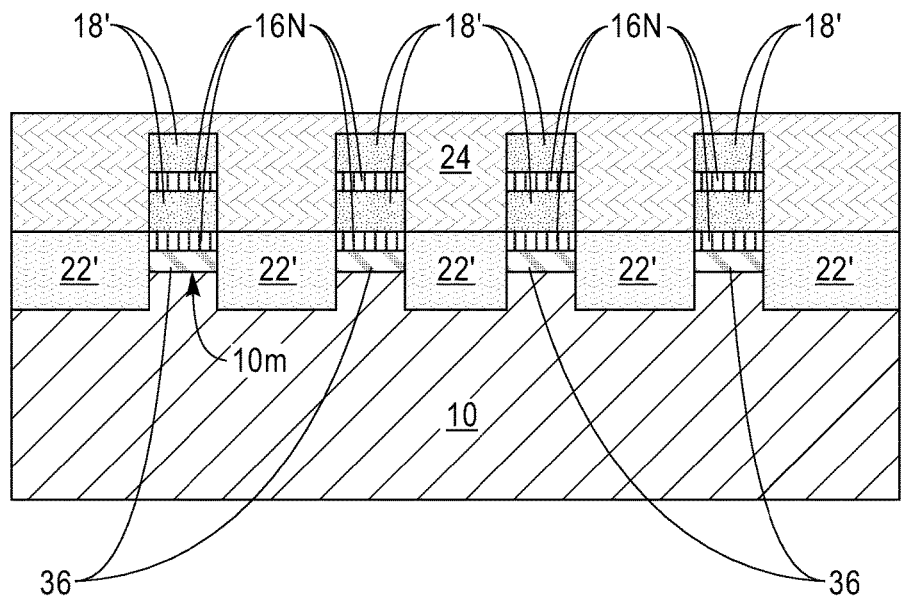
FIG. 7C is a vertical cross sectional view through line B-B shown in FIG. 7A.
Figure 7D:
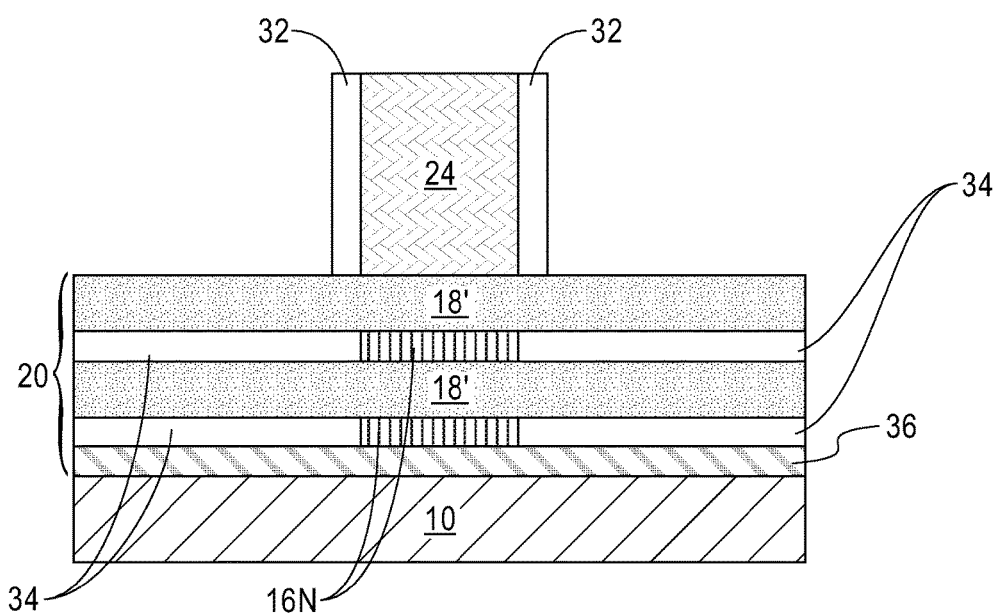
FIG. 7D is a vertical cross sectional view through line C-C shown in FIG. 7A.

Reference to FIGS. 1A and 1B, an initial structure that can be employed in one embodiment of the present application is provided. The initial structure includes a semiconductor substrate 10 having a base sacrificial semiconductor layer 12 located on a surface of the semiconductor substrate 10. The initial structure further includes a semiconductor material stack 14 located on the base sacrificial semiconductor layer 12. In some embodiments of the present application, the base sacrificial semiconductor layer 12 is omitted and the semiconductor material stack 14 is formed directly on an exposed surface of semiconductor substrate 10.

The semiconductor material stack 14 comprises alternating layers of a sacrificial semiconductor material and a semiconductor nanowire template material that can be employed in one embodiment of the present application. Each layer including the sacrificial semiconductor material is herein referred to as a sacrificial semiconductor material layer 16, and each layer including the semiconductor nanowire template material is herein referred to as a semiconductor nanowire template material layer 18. In accordance with the present application, each sacrificial semiconductor material layer 16 comprises a different semiconductor material than each semiconductor nanowire template material layer 18. Also, the topmost layer of the semiconductor material stack 14 comprises a semiconductor nanowire template material layer 18. The semiconductor material stack 14 can comprise at least two sacrificial semiconductor material layers 16 and at least two semiconductor nanowire template material layers 18, with the proviso that the topmost layer of the semiconductor material stack 14 is a semiconductor nanowire template material layer 18, and that each semiconductor nanowire template material layer 18 within the semiconductor material stack 14 is separated by a sacrificial semiconductor material layer 16. The term "semiconductor nanowire template material" is used throughout the present application to denote a semiconductor material that will be processed into a semiconductor nanowire.

The semiconductor substrate 10 that is employed in the present application can include any semiconductor material. Illustrative examples of semiconductor materials that can be used for the semiconductor substrate 10 include, but are not limited to, Si, SiGe alloys, SiGeC, SiC, Ge alloy, GaSb, GaP, GaN, GaAs, InAs, INP, AlN and all other III-V or II-VI compound semiconductors. In one embodiment, the semiconductor substrate 10 may comprise a multilayered stack of such semiconductor materials.

In some embodiments, the semiconductor substrate 10 may comprise a bulk semiconductor substrate. By "bulk" it is meant the entirety of the semiconductor substrate 10 from one surface to an opposite surface is composed of a semiconductor material. In other embodiments, the semiconductor substrate 10 may comprise a semiconductor-on-insulator substrate including a handle substrate, a buried insulator layer and a top semiconductor material layer. The handle substrate and the top semiconductor material layer may be composed of a same or different semiconductor material. In some embodiments, the handle substrate may be composed of a dielectric material such as, for example, glass or a polymer. The buried insulator layer may be composed of a dielectric oxide, dielectric nitride and/or dielectric oxynitride. In one example, the buried insulator layer can be composed of silicon oxide.

In one embodiment of the present application, the semiconductor substrate 10 may comprise a single crystalline semiconductor material. In another embodiment of the present application, the semiconductor substrate 10 may comprise a polycrystalline semiconductor material. In yet another embodiment, the semiconductor substrate 10 can comprise an amorphous semiconductor material. The semiconductor substrate 10 can be undoped, doped or contain regions that are undoped and other regions that are doped. In one example, the semiconductor substrate 10 may comprise a single crystalline semiconductor material that is entirely non-doped.

As stated above, the initial structure shown in FIG. 1B includes a base sacrificial semiconductor layer 12 located on a surface of semiconductor substrate 10. The base sacrificial semiconductor layer 12 comprises a different semiconductor material or composition than the semiconductor substrate 10. In one embodiment, the base sacrificial semiconductor layer 12 comprises a silicon germanium alloy of a first germanium content. In some embodiments of the present application, the base sacrificial semiconductor layer 12 has a same crystal orientation as the underlying semiconductor substrate 10. The base sacrificial semiconductor layer 12 is a contiguous (i.e., blanket) layer that is present across the entirety of the semiconductor substrate 10. As stated above and in some embodiments, the base sacrificial semiconductor layer 12 is omitted. The presence of the base sacrificial semiconductor layer 12 aids in reducing the parasitic capacitance of the stacked semiconductor nanowire field effect transistor of the present application.

In embodiments of the present application in which the base sacrificial semiconductor layer 12 is composed of a silicon germanium alloy of a first germanium content, the first germanium content can be from 20 atomic % germanium to 80 atomic % germanium, with the remainder up to 100% being silicon. In another embodiment of the present application, the first germanium content can be from 40 atomic % germanium to 60 atomic % germanium, with the remainder up to 100% being silicon.

The base sacrificial semiconductor layer 12 can be formed by an epitaxial growth (or deposition) process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. In accordance with an embodiment of the present application, the base sacrificial semiconductor layer 12 can be epitaxially grown at a temperature from 300° C. to 800° C. using a gas mixture that includes at least one source gas. In one embodiment of the present application, the at least one source gas used to form the base sacrificial semiconductor layer 12 may comprise a Si-containing precursor, such as, for example, a silane or a disilane, and/or a germanium-containing precursor such as, for example, a germane, $GeH_4$.

In one embodiment of the present application, the base sacrificial semiconductor layer 12 can be epitaxially grown utilizing chemical vapor deposition (CVD) or plasma enhanced chemical vapor deposition (PECVD). The base sacrificial semiconductor layer 12 can have a thickness from 5 nm to 25 nm, although lesser and greater thicknesses can also be employed.

In some embodiments of the present application, a dopant can be introduced into the base sacrificial semiconductor layer 12 providing a doped base sacrificial semiconductor layer. In one embodiment, a dopant source gas can be introduced during the epitaxial growth process. Such a process can be referred to as an in-situ epitaxial growth process. In another embodiment, a dopant can be introduced into a previously non-doped base sacrificial semiconductor layer by ion implantation, gas phase doping, or by a cluster beam process.

In one embodiment, a p-type dopant can be present in the base sacrificial semiconductor layer 12. In such an embodiment, the p-type dopant can be an element from Group IIIA of the Periodic Table of Elements, i.e., one of B, Al, and/or In. When a p-type dopant is employed, the content of p-type dopant within the base sacrificial semiconductor layer 12 can be from $1\times10^{17}$ atoms/cm$^3$ to $1\times10^{22}$ atoms/cm$^3$.

In another embodiment, an n-type dopant can be present in the base sacrificial semiconductor layer 12. In such an embodiment, the n-type dopant can be an element from Group VA of the Periodic Table of Elements, i.e., one of P, As, and/or Sb. When an n-type dopant is employed, the content of n-type dopant within the base sacrificial semiconductor layer 12 can be from $1\times10^{17}$ atoms/cm$^3$ to $1\times10^{22}$ atoms/cm$^3$.

Following the formation of the base sacrificial semiconductor layer 12, the semiconductor material stack 14 is formed on an exposed surface of the base sacrificial semiconductor layer 12. In some embodiments of the present application, each layer of the semiconductor material stack 14 has a same crystal orientation as the underlying base sacrificial semiconductor layer 12. In embodiments of the present application in which the base sacrificial semiconductor layer 12 is omitted, each layer of the semiconductor material stack 14 can have a same crystal orientation as the semiconductor substrate 10. Each layer in the semiconductor material stack 14 is a contiguous (i.e., blanket) layer that is present across the entirety of the base sacrificial semiconductor layer 12, or semiconductor substrate 10.

As mentioned above, the semiconductor material stack 14 includes alternating sacrificial semiconductor material layers 16 and semiconductor nanowire template material layers 18. Each sacrificial semiconductor material layer 16 comprises a different semiconductor material than each semiconductor nanowire template material layer 18. As also mentioned above, the topmost layer of the semiconductor material stack 14 is a semiconductor nanowire template material layer 18.

Each sacrificial semiconductor material layer 16 may comprise a same or different semiconductor material selected from Si, SiGe alloys, SiGeC, SiC, Ge alloy, GaSb, GaP, GaN, GaAs, InAs, INP, AlN and all other III-V or II-VI compound semiconductors. Each sacrificial semiconductor material layer 16 may comprise a same or different, typically the same, semiconductor material as that of the underlying base sacrificial semiconductor layer 12. Each sacrificial semiconductor material layer 16 comprises a different semiconductor material than the semiconductor substrate 10. In one embodiment, each sacrificial semiconductor material layer 16 is composed of a silicon germanium alloy having a second germanium content which is different from the first germanium content of a base sacrificial silicon germanium alloy layer. In one embodiment, the second germanium content may be at least half of the first germanium content. In such an embodiment and by way of an example, each sacrificial silicon germanium alloy material layer within the semiconductor material stack 14 may have a germanium content of from 1 atomic % germanium to 40 atomic % germanium, the remainder up to 100% being silicon. In one embodiment, the individual layers of sacrificial silicon germanium alloy material used as sacrificial semiconductor material layers 16 may each have a same second germanium content. In another embodiment, the individual layers of sacrificial silicon germanium alloy material used as sacrificial semiconductor material layers 16 may each have a different second germanium content. In a further embodiment, a first set of layers of sacrificial silicon germanium alloy material used as the sacrificial semiconductor material layers 16 may have a first value within the second germanium content range mentioned above, while a second set of layers of sacrificial silicon germanium alloy material used as sacrificial semiconductor material layers 16 may have a second value, that differs from the first value, but is yet within the second germanium content range mentioned above.

Each sacrificial semiconductor material layer 16 may be formed by an epitaxial growth process such as described above in forming the base sacrificial semiconductor layer 12. In one embodiment, each sacrificial semiconductor material layer 16 may be non-doped. In another embodiment, each sacrificial semiconductor material layer 16 may be doped with a p-type or n-type dopant. In another embodiment, a first set of sacrificial semiconductor material layers 16 can be non-doped, while a second set of sacrificial semiconductor material layers 16 can be doped. When doped, the dopant can be an n- or p-type dopant as described above in connection with the base sacrificial semiconductor layer 12. When doped, one of the doping techniques mentioned above can be used to introduce the dopant into the sacrificial semiconductor material layers 16. When doped, the dopant concentration can be in the range mentioned above for the base sacrificial semiconductor layer 12.

Each sacrificial semiconductor material layer 16 can have a thickness from 5 nm to 25 nm, although lesser and greater thicknesses can also be employed. In one embodiment, each sacrificial semiconductor material layer 16 may have a same thickness. In another embodiment, each sacrificial semiconductor material layer 16 may have a different thickness. In a further embodiment, a first set of sacrificial semiconductor material layers 16 may have a first thickness, while a second set of sacrificial semiconductor material layers 16 may have a second thickness that differs from the first thickness.

Each semiconductor nanowire template material layer 18 within the semiconductor material stack 14 may comprise a semiconductor material that differs from the semiconductor material present in each sacrificial semiconductor material layer 16 and the base sacrificial semiconductor layer 12. Thus, each semiconductor nanowire template material layer 18 within the semiconductor material stack 14 may comprise Si, SiGe, SiGeC, SiC, Ge alloy, GaSb, GaP, GaN, GaAs, InAs, INP, AlN and all other III-V or II-VI compound semiconductors. In one embodiment, each semiconductor nanowire template material layer 18 within the semiconductor material stack 14 may comprise a same semiconductor material. In yet another embodiment, each semiconductor nanowire template material layer 18 within the semiconductor material stack 14 may comprise a different semiconductor material. In yet a further embodiment, a first set of semiconductor nanowire template material layers 18 within semiconductor material stack 14 comprises a first semiconductor material, while a second set of semiconductor nanowire template material layers 18 within the semiconductor material stack 14 comprises a second semiconductor material which differs from the first semiconductor material. In one embodiment of the present application and when each sacrificial semiconductor material layer 16 comprises a silicon germanium alloy, each semiconductor nanowire template material layer 18 within semiconductor material stack 14 comprises silicon. Each semiconductor nanowire template material layer 18 within the semiconductor material stack 14 is typically, but not necessarily, non-doped. A dopant, i.e., n-type dopant or p-type dopant, can be introduced using an in-situ epitaxial deposition process, or by first forming a non-doped semiconductor material layer and thereafter introducing the dopant into the non-doped semiconductor material layer by ion implantation, gas phase doping, or a cluster beam process.

Each semiconductor nanowire template material layer 18 within the semiconductor material stack 14 may be formed by an epitaxial growth (or deposition process). In an embodiment of the present application, each semiconductor nanowire template material layer 18 can be epitaxially grown at a temperature from 300° C. to 800° C. using a gas mixture that includes at least one semiconductor source gas. In one example, each semiconductor nanowire template material layer 18 can be epitaxially grown at a temperature from 400° C. to 600° C. In one embodiment of the present application, each semiconductor nanowire template material layer 18 can be epitaxially grown utilizing PECVD. In one example, a PECVD device can employ a parallel plate chamber configuration. In other embodiments, a hot-wire chemical vapor deposition process can be used in forming each semiconductor nanowire template material layer 18.

In some embodiments of the present application, the epitaxial growth of the various sacrificial semiconductor material layers 16 and semiconductor nanowire template material layers 18 may be performed without breaking vacuum between the various depositions. Similarly, the epitaxial growth of the base sacrificial semiconductor layer 12 and the various layers (16, 18) of the semiconductor material stack 14 can be performed without breaking vacuum between the various depositions. In another embodiment of the present application, the vacuum may be broken between any of the various depositions.

In one embodiment of the present application, the at least one semiconductor source gas used to form the semiconductor nanowire template material layers 18 may comprise a Si-containing precursor, such as, for example, a silane or a disilane, and/or a germanium-containing precursor such as, for example, a germane, $GeH_4$.

Each semiconductor nanowire template material layer 18 can have a thickness from 5 nm to 25 nm, although lesser and greater thicknesses can also be employed. In one embodiment, each semiconductor nanowire template material layer 18 may have a same thickness. In another embodiment, each semiconductor nanowire template material layer 18 may have a different thickness. In a further embodiment, a first set of semiconductor nanowire template material layers 18 may have a first thickness, while a second set of semiconductor nanowire template material layers 18 may have a second thickness that differs from the first thickness.

In one embodiment of the present application, the semiconductor substrate 10 comprises single crystalline silicon, the base sacrificial semiconductor layer 12 comprises a silicon germanium alloy having a first germanium content, as defined above, each sacrificial semiconductor material layer 16 within the semiconductor material stack 14 comprises a silicon germanium alloy having a second germanium content, as defined above, and each semiconductor nanowire template material layer 18 within the semiconductor material stack 14 comprises silicon. In one embodiment, each of semiconductor substrate 10, base sacrificial semiconductor layer 12, sacrificial semiconductor material layer 16, and semiconductor nanowire template material layer 18 have a same crystal orientation.

Referring now to FIGS. 2A-D, there are illustrated various views of the structure shown in FIGS. 1A and 1B after forming at least one multilayered stacked semiconductor material structure 20 on a mesa surface 10*m* of the semiconductor substrate 10 and forming trench isolation structures 22 on recessed surfaces 10*r* of the semiconductor substrate 10 which are located adjacent the mesa surface 10*m*. The at least one multilayered stacked semiconductor material structure 20 includes a base sacrificial semiconductor portion 12' which is a remaining portion of the base sacrificial semiconductor layer 12, and alternating sacrificial semiconductor material portions 16' and semiconductor nanowire template material portions 18' which are remaining portions of sacrificial semiconductor material layers 16 and semiconductor nanowire template material layers 18, respectively.

As is shown, a topmost surface of each trench isolation structure 22 that is formed may extend above the topmost surface of the semiconductor substrate 10. In one embodiment, the topmost surface of each trench isolation structure 22 that is formed may extend above an upper surface of the base sacrificial semiconductor portion 12'. In yet another embodiment, the topmost surface of each trench isolation structure 22 that is formed may be coplanar with an upper surface of each bottommost sacrificial semiconductor material portion 16' of each multilayered stacked semiconductor material structure 20.

As is also shown, the base sacrificial semiconductor portion 12', and alternating sacrificial semiconductor material portions 16' and semiconductor nanowire template material portions 18' which form each multilayered stacked semiconductor material structure 20 have sidewall surfaces that are vertically coincident with each other. By "vertically coincident" it is meant that that the sidewalls of the base sacrificial semiconductor portion 12', the sacrificial semiconductor material portions 16' and the semiconductor nanowire template material portions 18' are vertically aligned with one another.

The structure shown in FIGS. 2A-2D is formed by first providing a trench pattern through the semiconductor material stack 14, through the base sacrificial semiconductor layer 12 and into portions of the semiconductor substrate 10. The trench pattern can be formed by lithography and etching. Lithography can include forming a photoresist (not shown) on an exposed surface of the semiconductor material stack 14, exposing the photoresist to a desired pattern of radiation, and then developing the exposed photoresist with a conventional resist developer to provide a patterned photoresist atop the semiconductor material stack 14. At least one etch is then employed which transfers the pattern from the patterned photoresist through the semiconductor material stack 14, through the base sacrificial semiconductor layer 12 and into portions of the semiconductor substrate 10. In one embodiment, the etch used for pattern transfer may include a dry etch process such as, for example, reactive ion etching, plasma etching, ion beam etching and laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern through the semiconductor material stack 14, through the base sacrificial semiconductor layer 12 and into portions of the semiconductor substrate 10, the patterned photoresist can be removed utilizing a conventional resist stripping process such as, for example, ashing.

In some embodiments, a hard mask such as, for example, a dielectric oxide can be formed by, for example, a deposition process, atop the surface of the semiconductor material stack 14 prior to application of the photoresist. In such an embodiment, the pattern from the patterned photoresist is first transferred into the hard mask and then into the underlying material layers. The patterned photoresist can be removed anytime after the hard mask has been patterned. Remaining portions of the hard mask may remain atop each multilayered stacked semiconductor material structure 20, and can be removed during the formation of the trench isolation structures 22.

The remaining portion of the semiconductor material stack 14 and the remaining portion of the base sacrificial semiconductor layer 12' collectively define the least one multilayered stacked semiconductor material structure 20.

After pattern transfer through the semiconductor material stack 14, through the base sacrificial semiconductor layer 12 and into portions of the semiconductor substrate 10, trenches are provided into the semiconductor substrate 10. Each trench can have a recessed surface 10r as compared to non-recessed surfaces of the semiconductor substrate 10. The non-recessed surfaces of the semiconductor substrate 10 can be referred to herein as mesa surfaces 10m. Atop each mesa surface 10m is present a multilayered stacked semiconductor material structure 20.

Each trench is then filled with a trench dielectric material such as an oxide forming the trench isolation structures 22. In one embodiment, the trench fill can be performed utilizing a high-density plasma oxide deposition process. In another embodiment, the trench fill can be performed by deposition of tetrethylorothosilicate. In some embodiments, and when a remaining portion of the hard mask is present atop each of the multilayered stacked semiconductor material structures 20, each remaining portion of the hard mask can be removed from atop the multilayered stacked semiconductor material structures 20 by a planarization process such as, for example, chemical mechanical polishing.

When a plurality of multilayered stacked semiconductor material structures 20 are formed, each multilayered stacked semiconductor material structure 20 is oriented parallel to one another. In one embodiment, the distance between neighboring multilayered stacked semiconductor material structures 20 can be from 10 nm to 200 nm. In another embodiment, the distance between neighboring multilayered stacked semiconductor material structures 20 can be from 25 nm to 50 nm. In one embodiment, each multilayered stacked semiconductor material structure 20 that is formed has a width from 4 nm to 20 nm, and a length from 0.1 µm to 10 µm. In another embodiment, each multilayered stacked semiconductor material structure 20 that is formed has a width from 5 nm to 7 nm, and a length from 1 µm to 2 µm.

Referring now FIGS. 3A-3D, there are illustrated the structure shown in FIGS. 2A-2D after forming at least one sacrificial gate material structure 24 on exposed portions of each trench isolation structure 22 and straddling each multilayered stacked semiconductor material structure 20. As shown, each sacrificial gate material structure 24 is oriented in a direction that is perpendicular to each multilayered stacked semiconductor material structure 20.

The at least one sacrificial gate material structure 24 is formed by first providing a blanket layer of a sacrificial gate material on the exposed surfaces of the structure shown in FIGS. 2A-2D. The blanket layer of sacrificial gate material can be formed, for example, by CVD or PECVD. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. In some embodiments of the present application, an optional blanket layer of sacrificial gate dielectric material may be formed beneath the blanket layer of sacrificial gate material. The blanket layer of sacrificial gate dielectric material may include a dielectric oxide or a dielectric nitride.

After providing the blanket layer of sacrificial gate material, the blanket layer of sacrificial gate material and the blanket layer of sacrificial gate dielectric material, if present, can be patterned by lithography and etching so as to form the at least one sacrificial gate material structure 24. Lithography can include forming a photoresist (not shown) on an exposed surface of the blanket layer of sacrificial gate material, exposing the photoresist to a desired pattern of radiation, and then developing the exposed photoresist with a conventional resist developer to provide a patterned photoresist atop the blanket layer of sacrificial gate material. An etch is then employed which transfers the pattern from the patterned photoresist into the underlying blanket layer of sacrificial gate material and blanket layer of sacrificial gate dielectric material, if present. In one embodiment, the etch used to transfer the pattern from the patterned photoresist into the underlying blanket layer of sacrificial gate material and blanket layer of sacrificial gate dielectric material, if present, may include a dry etch process such as, for example, reactive ion etching, plasma etching, ion beam etching and laser ablation. In another embodiment, the etch used to transfer the pattern from the patterned photoresist into the underlying blanket layer of sacrificial gate material and blanket layer of sacrificial gate dielectric material, if present, may include a wet chemical etchant such as, for example, KOH. In yet another embodiment, a combination of a dry etch and a wet chemical etch may be used to transfer the pattern from the patterned photoresist into the underlying blanket layer of sacrificial gate material. After transferring the pattern into the underlying layer of sacrificial gate material, the patterned photoresist can be removed utilizing a conventional resist stripping process such as, for example, ashing.

When a plurality of sacrificial gate material structures 24 are formed, each sacrificial gate material structures 24 is oriented parallel to one another. In one embodiment, the distance between neighboring sacrificial gate material structures 24 can be from 10 nm to 200 nm. In another embodiment, the distance between neighboring sacrificial gate material structures 24 can be from 25 nm to 50 nm. In one embodiment, each sacrificial gate material structure 24 that is formed has a width from 10 nm to 100 nm, and a length from 50 nm to 20,000 nm. In another embodiment, each sacrificial gate material structure 24 that is formed has a width from 15 nm to 20 nm, and a length from 500 nm to 1000 nm.

Referring now to FIGS. 4A-4D, there are shown the structure of FIGS. 3A-3D after removing exposed portions of sacrificial semiconductor material portions 16' that are not covered by the sacrificial gate material structures 24 from each multilayered stacked semiconductor material structure 20. As shown, portions of sacrificial semiconductor material portions 16' located beneath the sacrificial gate material structures 24 are not removed. Each non-removed portion of sacrificial semiconductor material portion 16 is herein referred to as a non-removed sacrificial semiconductor material portion 16N.

The removal of exposed portions of sacrificial semiconductor material portions 16' from each multilayered stacked semiconductor material structure 20 can be performed by a directional etching process selective to semiconductor nanowire template material portions 18'. In one embodiment of the present application, the removal of exposed portions of sacrificial semiconductor material portions 16' from each multilayered stacked semiconductor material structure 20 can be performed by a gas cluster ion beam (GCIB) etch. The GCIB etching process may be performed with an ion dose from $0.5 \times 10^{15}$ ion-clusters/cm$^2$ to $2.5 \times 10^{15}$ ion-clusters/cm$^2$. The gas used in the GCIB process may be composed of a reactive gas such as, for example, nitrogen trifluoride (NF$_3$), sulfur hexafluoride (SF$_6$), chlorine (Cl$_2$), in combination with a carrier gas such as, for example, nitrogen (N$_2$) and argon (Ar). In another embodiment of the present application, the removal of exposed portions of sacrificial semiconductor material portions 16' from each multilayered stacked semiconductor material structure 20 can be performed by implanting ions into exposed portions of sacrificial semiconductor material portions 16' in each multilayered stacked semiconductor material structure 20 to create damaged exposed portions and subsequently removing the damaged exposed portions.

As shown, the non-removed sacrificial semiconductor material portions 16N within each multilayered stacked semiconductor material structure 20 have sidewall surfaces that are vertically coincident with sidewall surfaces of sacrificial gate material structures 24.

Referring now to FIGS. 5A-5D, there are illustrated the structure shown in FIGS. 4A-4D after simultaneously forming a first spacer 32 on each sidewall surface of the at least one sacrificial gate material structure 24 and forming a second spacer 34 within an area previously occupied by each exposed portion of each sacrificial semiconductor material portions 16' within each multilayered stacked semiconductor material structure 20.

The first and second spacers 32, 34 can be formed by first providing a spacer material on the sacrificial gate material structures 24, the multilayered stacked semiconductor material structures 20 and the trench isolation structures 22 as well as within the areas previously occupied by the exposed portions of each sacrificial semiconductor material portions 16' of each multilayered stacked semiconductor material structure 20 and then etching the spacer material to remove the spacer material from top surface of the at least one sacrificial gate material structure 23 and the trench isolation structures 22. The spacer material may be composed of any dielectric spacer material including, for example, a dielectric oxide, dielectric nitride, and/or dielectric oxynitride. In one example, the spacer material may be composed of silicon oxide or silicon nitride. The spacer material can be provided by a deposition process including, for example, CVD, PECVD, or physical vapor deposition (PVD). The etching of the spacer material may comprise a dry etch process such as, for example, a reactive ion etch. As shown, each first spacer 32 has a bottom surface that is present on portions of the trench isolation structures 22 and each first spacer 32 straddles portions of each multilayered stacked semiconductor material structure 20. The second spacers 34 fills the areas previously occupied by the exposed portions of each sacrificial semiconductor material portions 16' and contact sidewall surfaces of each non-removed sacrificial semiconductor material portion 16N within each multilayered stacked semiconductor material structure 20.

Referring now to FIGS. 6A-6E, there are illustrated the structure of FIGS. 5A-5D after recessing exposed portions of the trench isolation structures 22 below a bottommost surface of the base sacrificial semiconductor portion 12' of each multilayered stacked semiconductor material structure 20. In some embodiments, the recessing step provides recessed trench isolation structures 22' having an upper surface that is coplanar with the mesa surfaces 10m of the semiconductor substrate 10. The recessing of the trench isolation structures 22 can be performed using a wet chemical etch process such as, for example, HF. In some embodiments of the present application in which the base sacrificial semiconductor layer 12 is not employed, this step of the present application can be omitted.

Referring now to FIGS. 7A-7D, there are illustrated the structure of FIGS. 6A-6E after removing an entirety of the base sacrificial semiconductor portion 12' from each multilayered stacked semiconductor material structure 20. The removal of the entirety of the base sacrificial semiconductor portion 12' from each multilayered stacked semiconductor material structure 20 can be performed utilizing an etch process. In one embodiment of the present application, an etch selective to non-removed semiconductor material portions 16N and semiconductor nanowire template material portions 18' can be used to remove the entirety of the base sacrificial semiconductor portion 12' from each multilayered stacked semiconductor material structure 20. In one example, the selective etch can include an HCl vapor.

The removal of the entirety of the base sacrificial semiconductor portion 12' from each multilayered stacked semiconductor material structure 20 creates a gap 36 between the semiconductor substrate 10 and each multilayered stacked semiconductor material structure 20, thus suspending each multilayered stacked semiconductor material structure 20 over the mesa surface 10m of the semiconductor structure 10. Thus, and in some embodiments of the present application, the bottommost surface of each multilayered stacked semiconductor material structure 20 is now exposed. In another embodiment, the bottommost surface of each multilayered stacked semiconductor material structure 20 remains in direct contact with the semiconductor substrate 10.

Figure 8A:
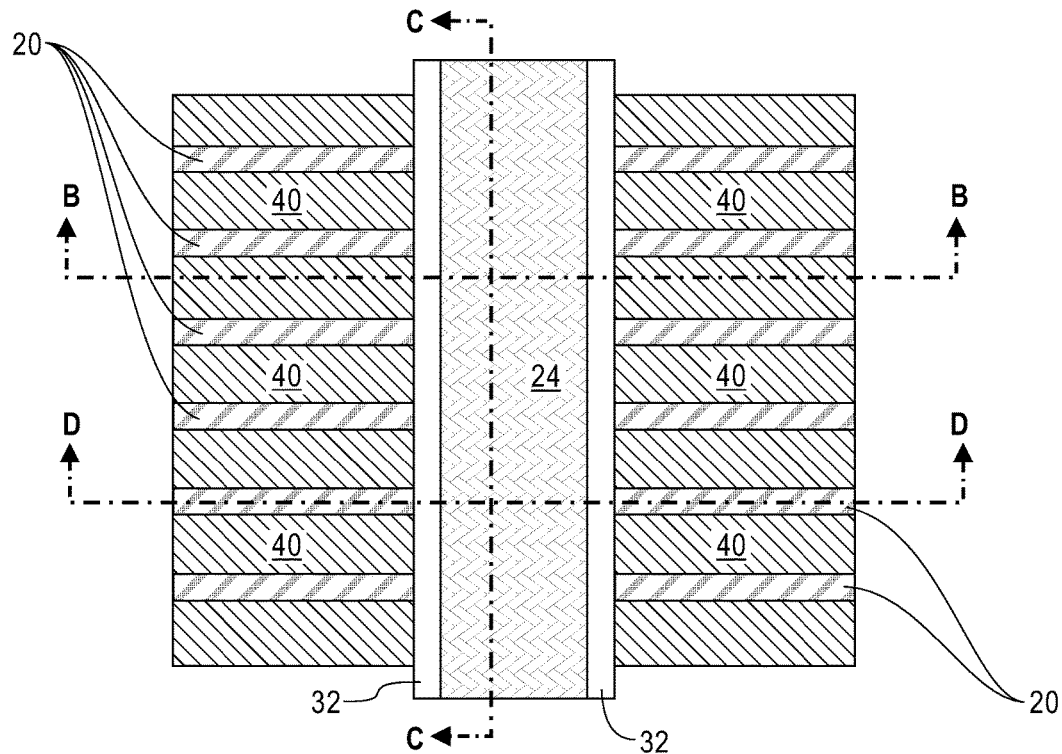
FIG. 8A is a top-down view of the structure shown in FIG. 7A after forming an oxide and planarizing the oxide.
Figure 8B:
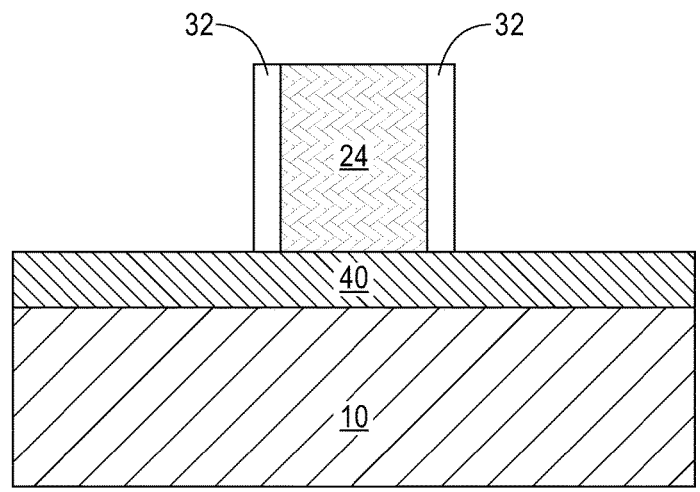
FIG. 8B is a vertical cross sectional through line A-A shown in FIG. 8A.
Figure 8C:
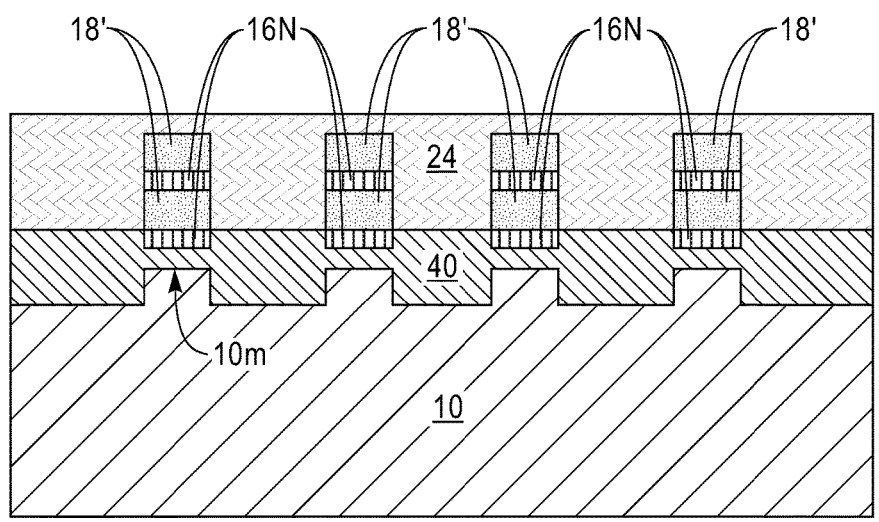
FIG. 8C is a vertical cross sectional view through line B-B shown in FIG. 8A.
Figure 8D:
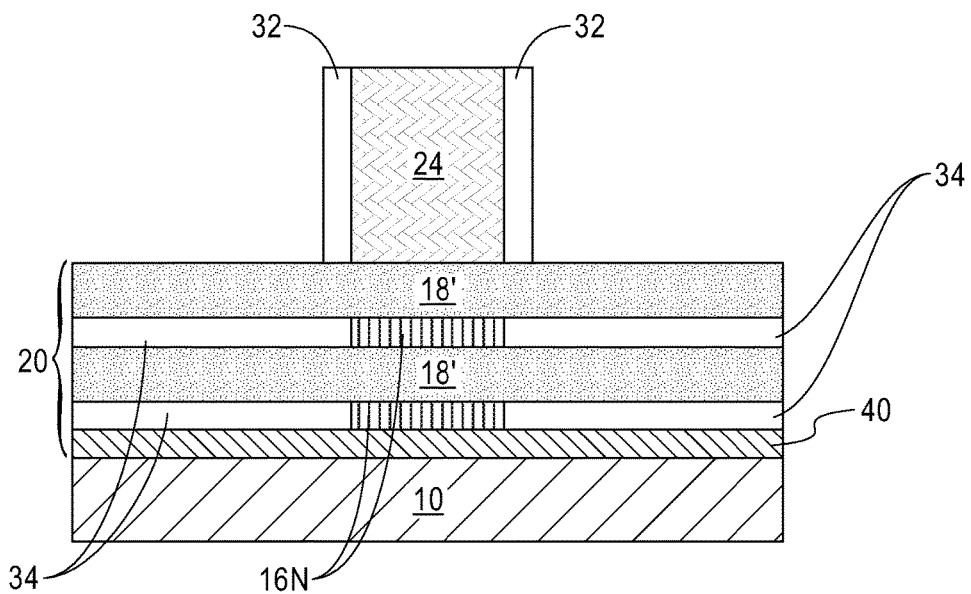
FIG. 8D is a vertical cross sectional view through line C-C shown in FIG. 8A.
Figure 9A:
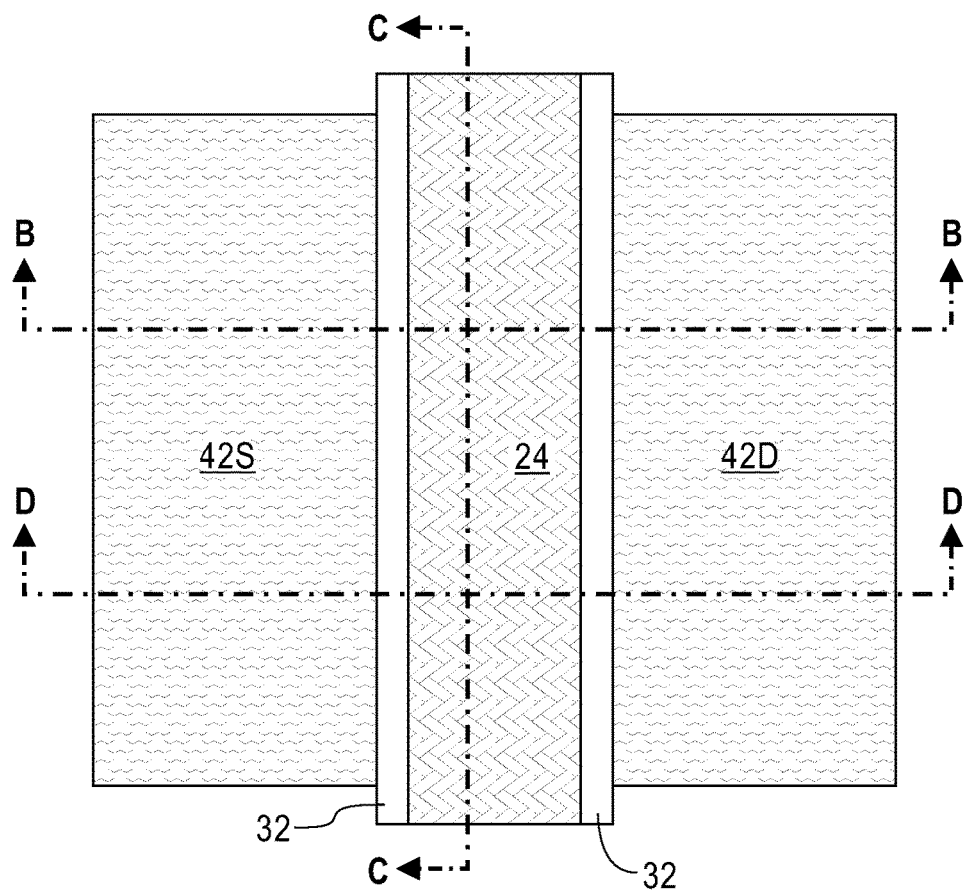
FIG. 9A is a top-down view of the structure shown in FIG. 8A after removing portions of each semiconductor nanowire template material portion and each second spacer that are not covered by the at least one sacrificial gate material structure and each first spacer and forming a source region on one side of each sacrificial gate material structure and a drain region on the other side of the each sacrificial gate material structure.
Figure 9B:
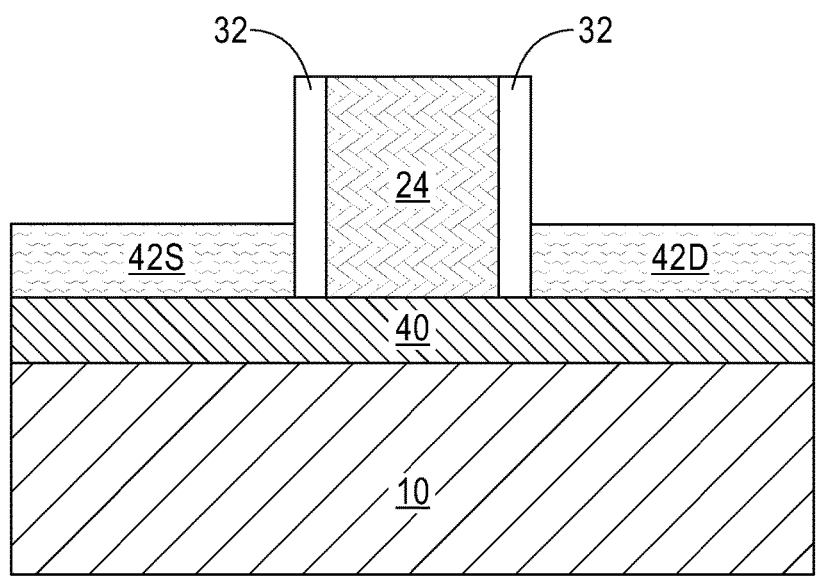
FIG. 9B is a vertical cross sectional through line A-A shown in FIG. 9A.
Figure 9C:
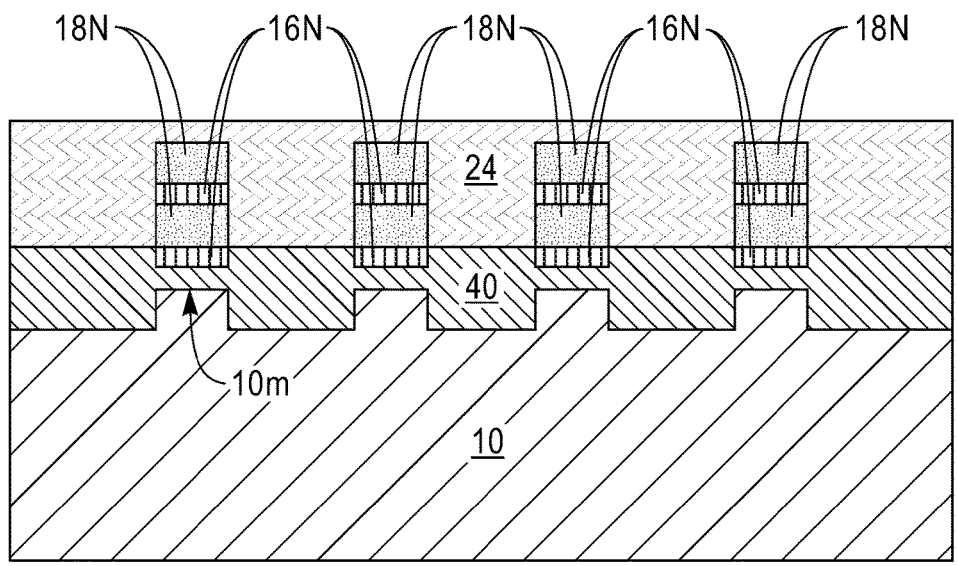
FIG. 9C is a vertical cross sectional view through line B-B shown in FIG. 9A.
Figure 9D:
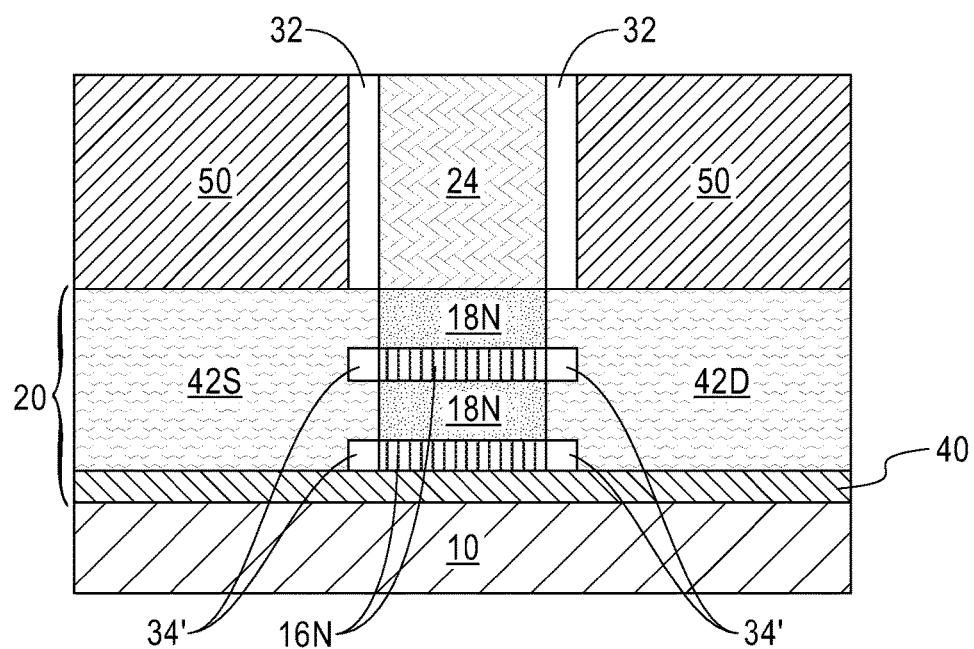
FIG. 9D is a vertical cross sectional view through line C-C shown in FIG. 9A.
Figure 10A:
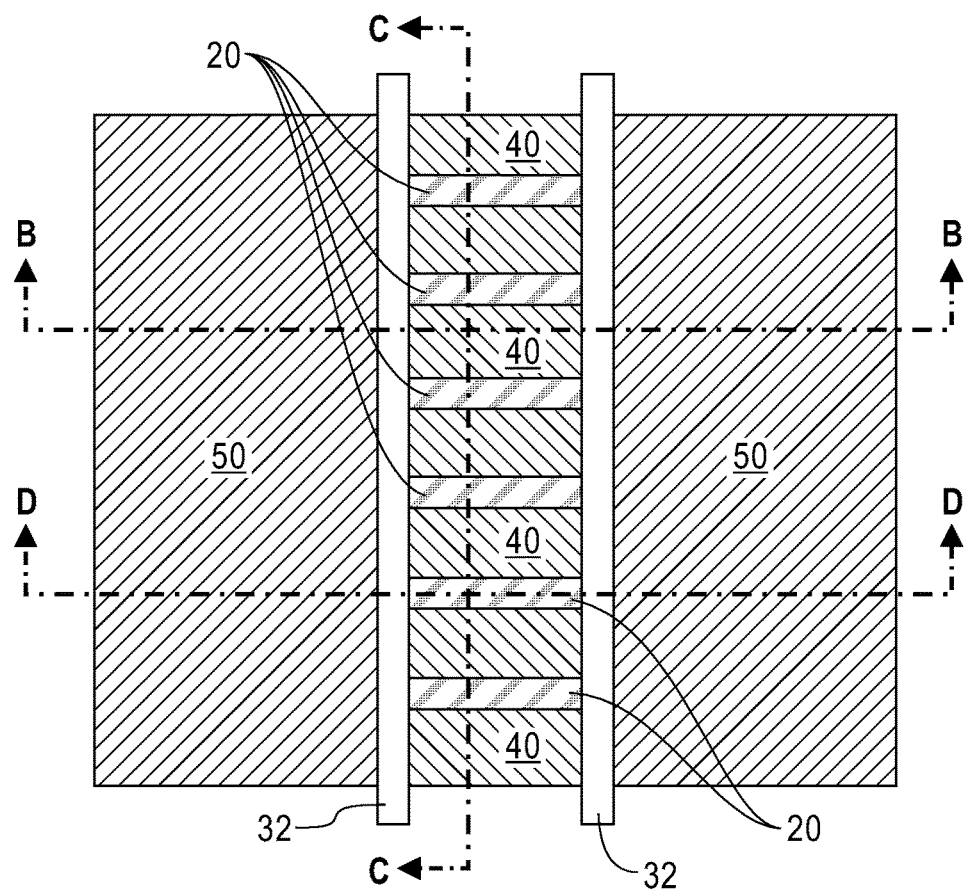
FIG. 10A is a top-down view of the structure shown in FIG. 9A after forming an interlevel dielectric (ILD) layer atop the source region and the drain region and providing a gate cavity by removing the at least one sacrificial gate material structure.
Figure 10B:
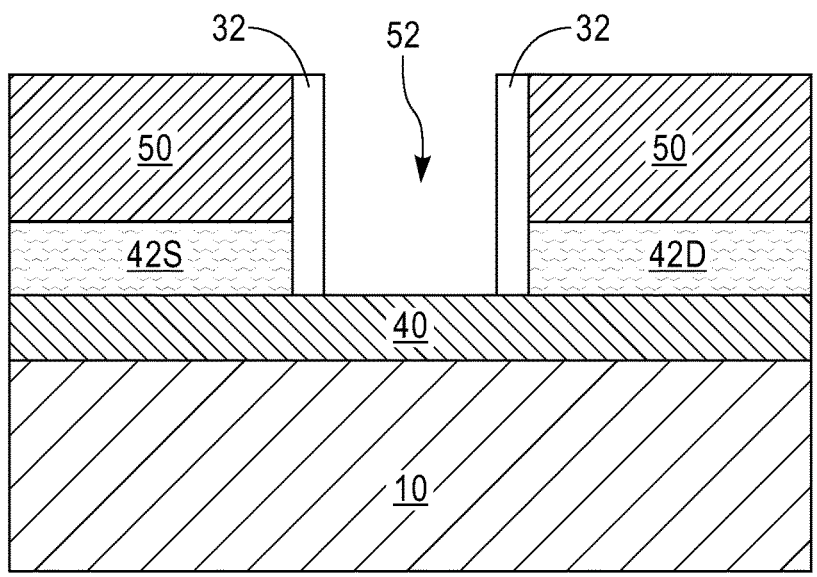
FIG. 10B is a vertical cross sectional through line A-A shown in FIG. 10A.
Figure 10C:
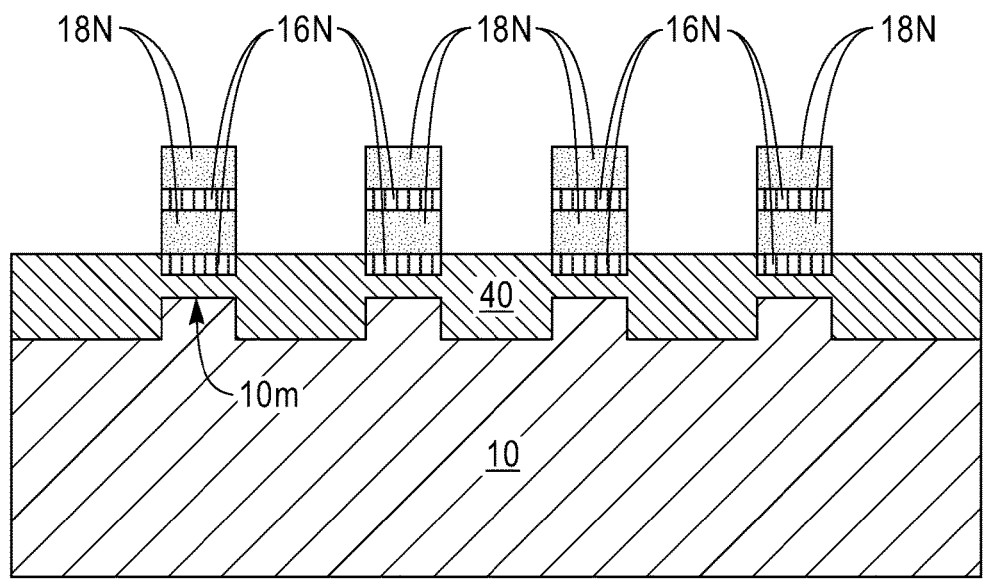
FIG. 10C is a vertical cross sectional view through line B-B shown in FIG. 10A.
Figure 10D:
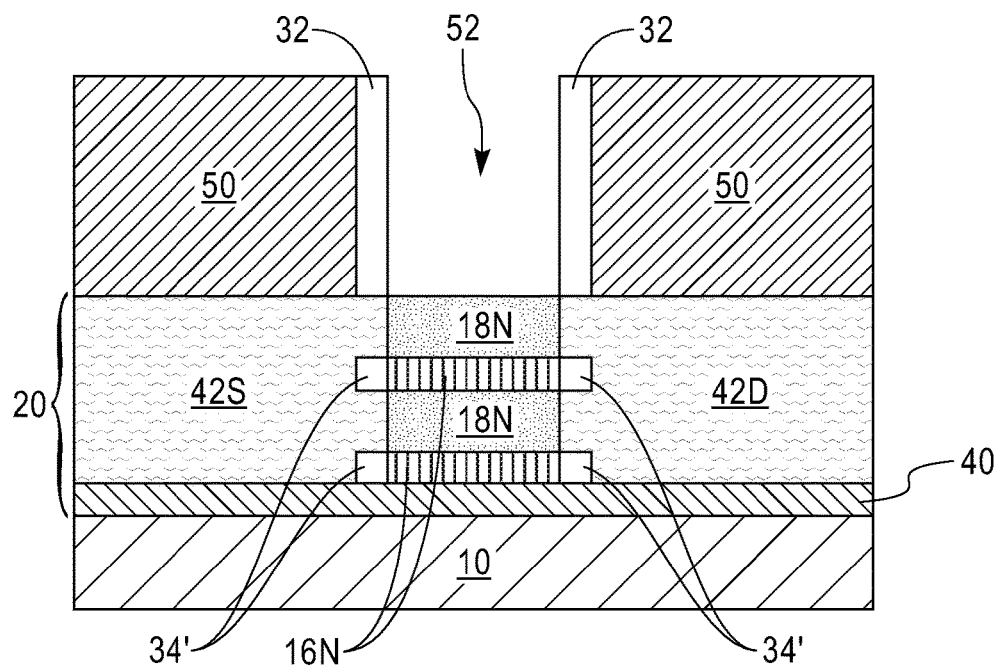
FIG. 10D is a vertical cross sectional view through line C-C shown in FIG. 10A.
Figure 11A:
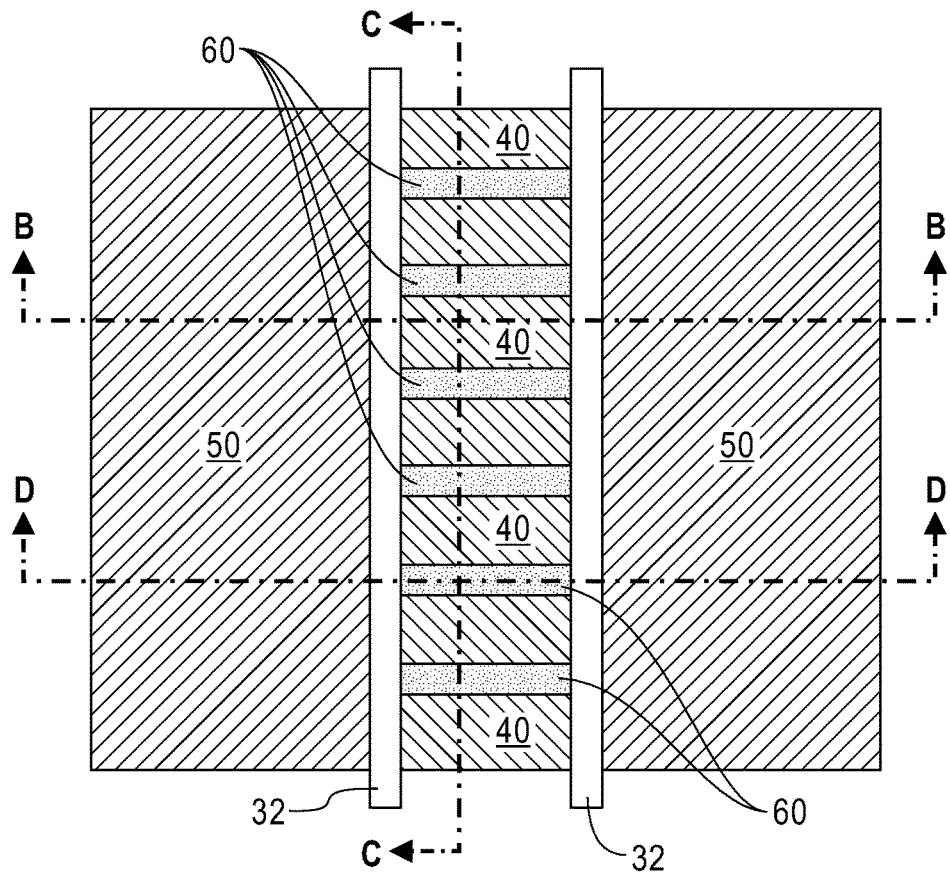
FIG. 11A is a top-down view of the structure shown in FIG. 10A after removing each non-removed sacrificial semiconductor material portion from each multilayered stacked semiconductor material structure.
Figure 11B:
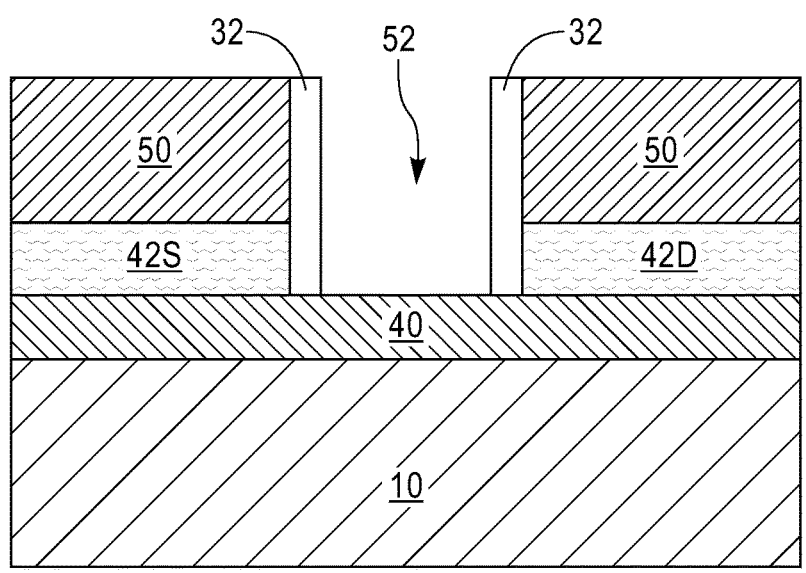
FIG. 11B is a vertical cross sectional through line A-A shown in FIG. 11A.
Figure 11C:
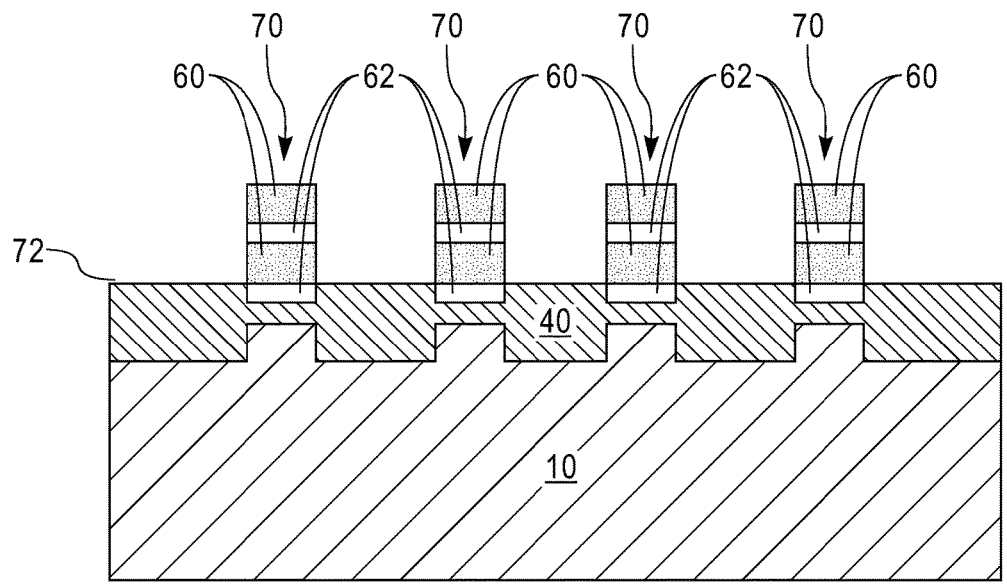
FIG. 11C is a vertical cross sectional view through line B-B shown in FIG. 11A.
Figure 11D:
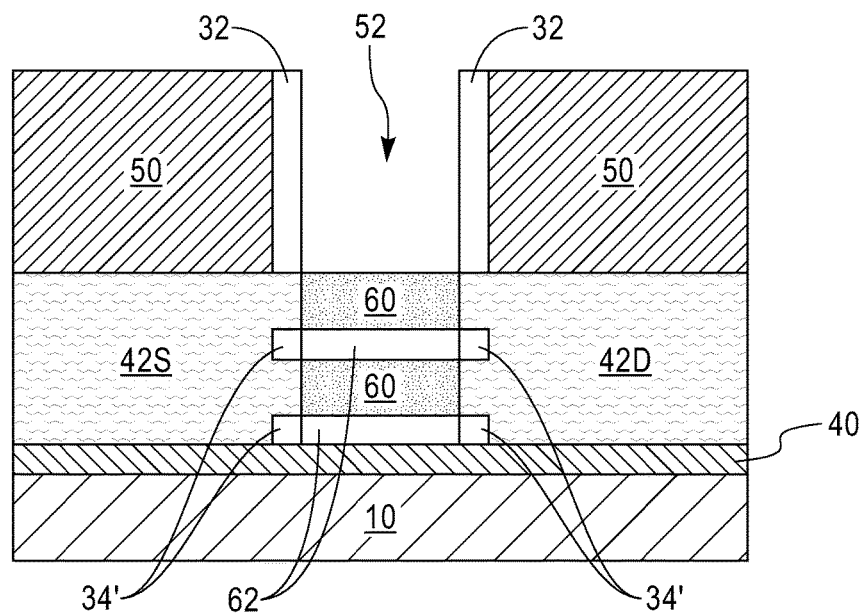
FIG. 11D is a vertical cross sectional view through line C-C shown in FIG. 11A.
Figure 12A:
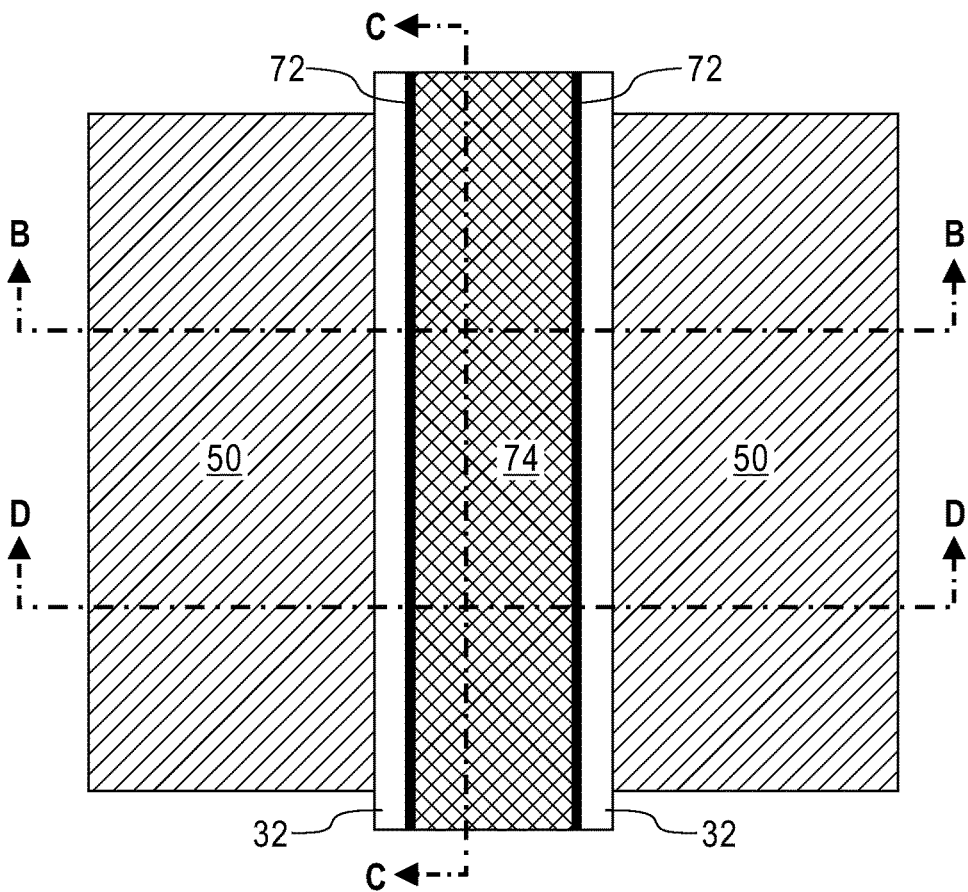
FIG. 12A is a top-down view of the structure shown in FIG. 11A after forming a gate dielectric and a gate conductor within each gate cavity and within an area previously occupied by each non-removed sacrificial semiconductor material portion.
Figure 12B:
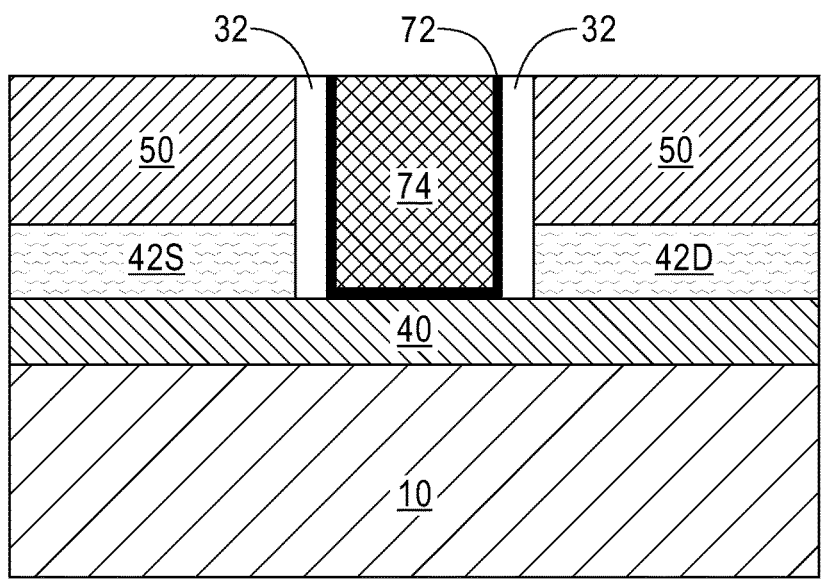
FIG. 12B is a vertical cross sectional through line A-A shown in FIG. 11A.
Figure 12C:
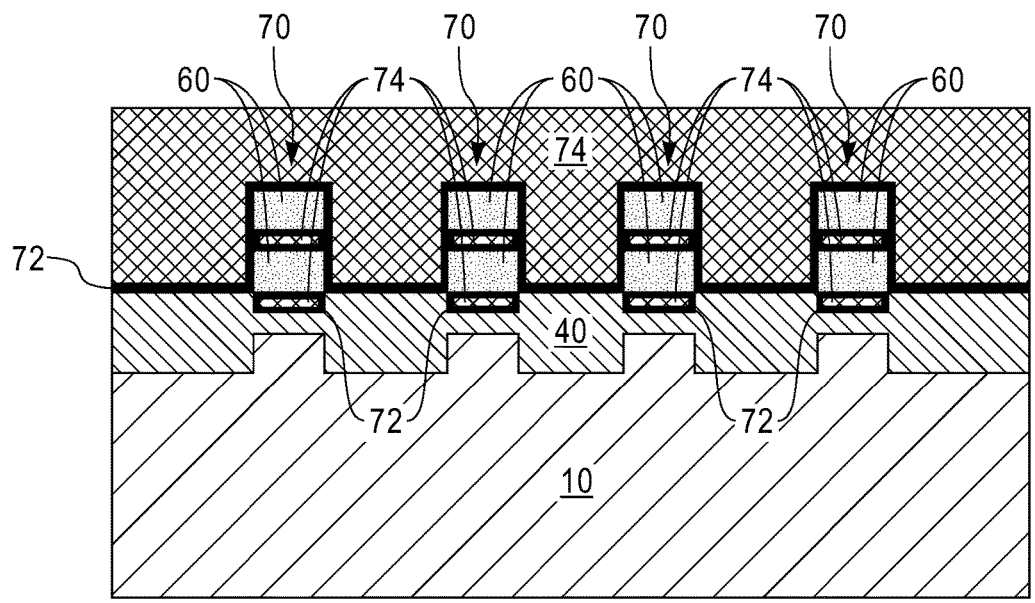
FIG. 12C is a vertical cross sectional view through line B-B shown in FIG. 12A.
Figure 12D:
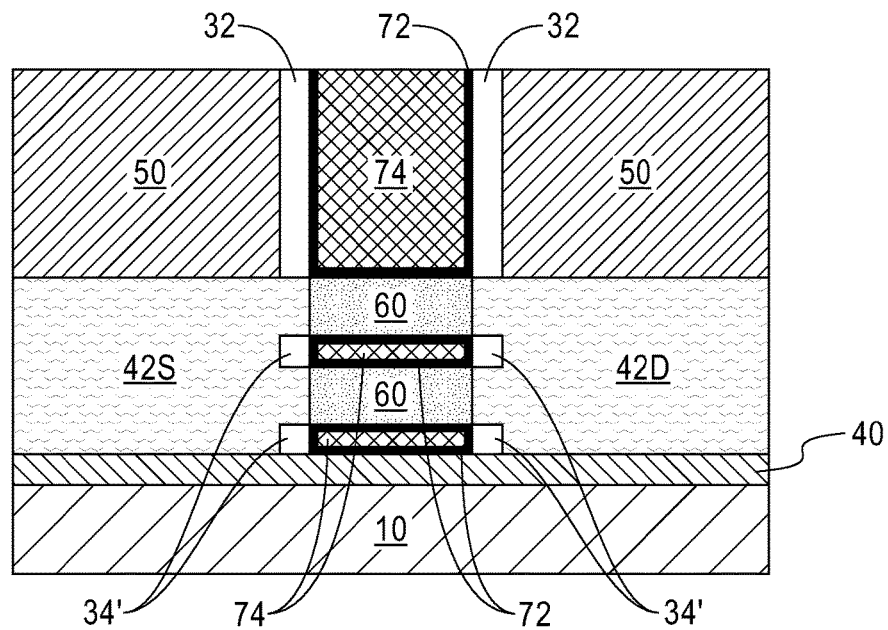
FIG. 12D is a vertical cross sectional view through line C-C shown in FIG. 12A.

Referring now to FIGS. 8A-8D, there are illustrated the structure of FIGS. 7A-7D after forming an oxide and planarizing the oxide. The planarized oxide is present on exposed portions of each recessed trench isolation structure 22' and it also fills each gap 36. The planarized oxide and the recessed trench isolation structures 22' taken together form feature-containing trench isolation structures 40 within the structure. As can be seen in FIG. 8C, the upper surface of the feature-containing trench isolation structure 40 extends above the mesa surface 10m of the semiconductor substrate 10. In one embodiment, the upper surface of the feature-containing trench isolation structure 40 can be coplanar with an upper surface of the bottommost non-removed sacrificial semiconductor material portion 16N of each multilayered stacked semiconductor material structure 20.

The oxide can be formed utilizing any deposition process including those mentioned above in forming the trench isolation structures 22. The planarizing process may comprise chemical mechanical polishing followed by an etch process.

Referring now to FIGS. 9A-9D, there are illustrated the structure of FIGS. 8A-8D after forming a source region 42S on one side of each sacrificial gate material structure 24 and forming a drain region 42D on the other side of each sacrificial gate material structure 24. The source region 42S and the drain region 42D can be formed by first removing exposed portions of the semiconductor nanowire template material portions 18' and the underlying exposed portions of the second spacers 34 that are not protected by each sacrificial gate material structure 24 and each first spacer 32. The removal of the exposed portions of the semiconductor nanowire template material portions 18' and the underlying exposed portions of the second spacers 34 that are not protected by each sacrificial gate material structure 24 and each first spacer 32 can comprise an etching process. In one example, a reactive ion etch can be used to remove the exposed portions of the semiconductor nanowire template material portions 18' and the underlying exposed portions of the second spacers 34 that are not protected by each sacrificial gate material structure 24 and each first spacer 32.

The remaining portion of each semiconductor nanowire template material portion 18' is herein referred to as a non-removed semiconductor nanowire template material portion 18N. The remaining portion of each second spacer 34 is referred to herein as a tunnel spacer 34' since each tunnel spacer 34' is located beneath a non-removed semiconductor nanowire template material portion 18N. As is shown, a sidewall surface of each tunnel spacer 34' is vertically coincident with an outer sidewall of a first spacer 32.

After the removal of the exposed portions of each semiconductor nanowire template material portion 18' and the underlying exposed portions of the second spacer 34 that are not protected by each sacrificial gate material structure 24 and each first spacer 32, sidewall surfaces of each non-removed semiconductor nanowire template material portion 18N are exposed.

Next, a semiconductor material is epitaxial grown from the exposed sidewall surfaces of each non-removed semiconductor nanowire template material portion 18N. In one embodiment, the semiconductor material used as the source region 42S and the drain region 42D can comprise a same semiconductor material as that of each non-removed semiconductor nanowire template material portion 18N, yet a different semiconductor material than the non-removed sacrificial semiconductor material portion 16N. In another embodiment, the semiconductor material used as the source region 42S and the drain region 42D can comprise a different semiconductor material as that of each non-removed semiconductor nanowire template material portion 18N so long as the semiconductor material used in providing the source/drain regions 42S, 42D is different from the non-removed sacrificial semiconductor material portion 16N.

In addition to including a semiconductor material, the source region 42S and the drain region 42D also include an n-type or p-type dopant. The dopant can be provided during the epitaxial growth process, or after epitaxial growth by one of ion implantation and gas phase doping. The dopant in the source region 42S and drain region 42D can be activated at a temperature between 700° C. and 1000° C. by, for example, a rapid thermal anneal process. In some embodiments of the present application, the annealing may result in a lateral diffusion of dopant into end portions of each non-removed semiconductor nanowire template material portion 18N underlying the first spacers 32. As shown, sidewall surfaces of an undoped portion of each non-removed semiconductor nanowire template material portion 18N are vertically coincident with inner sidewall surfaces of the first spacers 32.

As shown, the upper surface of the source region 42S and the drain region 42D are coplanar to the topmost surface of each multilayered stacked semiconductor material structure 20. As is also shown, the bottommost surface of the source region 42S and drain region 42D are present on an oxide surface portion (i.e., a portion of the feature containing trench isolation structure 40) that is present on a surface of the semiconductor substrate 10.

Referring now to FIGS. 10A-10D, there are illustrated the structure of FIGS. 9A-9D after forming an interlevel dielectric (ILD) layer 50 atop the source region 42S and atop the drain region 42D and providing a gate cavity 52 by removing each sacrificial gate material structure 24 to expose a topmost undoped portion of each non-removed semiconductor nanowire template material portion 18N within the multilayered stacked semiconductor material structure 20, Prior to removing each sacrificial gate material structure 24 from the structure, the ILD layer 50 has an upper surface that is coplanar with an upper exposed surface of each sacrificial gate material structure 24. In some embodiments, the ILD layer 50 may be composed of, for example, silicon dioxide, undoped silicate glass (USG), fluorosilicate glass (FSG), borophosphosilicate glass (BPSG), a spin-on low-k dielectric material, a low-k dielectric material or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD layer 50. The use of a self-planarizing dielectric material as ILD layer 50 may avoid the need to perform a subsequent planarizing step.

In one embodiment, the ILD layer 50 can be formed utilizing a conventional deposition process including, for example, CVD, PECVD, evaporation and spin-on coating. In some embodiments, particularly when non-self-planarizing dielectric materials are used, a planarization process or an etch back process follows the deposition of the dielectric material.

Each gate cavity 52 can be formed by removing each of the sacrificial gate material structures 24 from the structure. Each sacrificial gate material structure 24 can be removed by etching. In one example, a reactive ion etch can be used to removal each sacrificial gate material structure 24.

Referring to FIGS. 11A-11D, there are illustrated the structure of FIGS. 10A-10D after removing each non-removed sacrificial semiconductor material portion 16N of the multilayered stacked semiconductor material structure 20 by etching. In one embodiment of the present application, the etch includes an HCl vapor etch. The etch removes each previously non-removed sacrificial semiconductor material portion 16N from beneath the undoped portion of each non-removed semiconductor nanowire template material portion 18N without substantially affecting each tunnel spacer 34' laterally surrounding the undoped portion of each non-removed semiconductor nanowire template material portion 18N. The undoped portion of each non-removed semiconductor nanowire template material portion 18N can now be referred to as a semiconductor nanowire 60. Semiconductor nanowires that are located within a same region of the structure collectively can be referred to as a stacked nanowire array 70. As shown, each semiconductor nanowire 60 within a stacked semiconductor nanowire array 70 is vertically spaced apart from each other. In some cases, the bottommost semiconductor nanowire 60 of a stacked semiconductor nanowire array 70 is separated from an oxide surface portion (i.e., a portion of the feature containing trench isolation structure 40) that is present on a surface of the semiconductor substrate 10. Each vertically spaced apart semiconductor nanowire 60 within a given stacked semiconductor nanowire array 70 is connected to a corresponding source region 42S and corresponding drain region 42D. Gap 62 is present beneath each of the vertically spaced apart semiconductor nanowires 60 and is laterally surrounded by tunnel spacers 34'.

Referring now to FIGS. 12A-12D, there are shown the structure of FIGS. 11A-11D after forming a gate dielectric 72 and a gate conductor 74 within the gate cavity 52 and within each gap 62. The gate dielectric and gate conductor taken together form a first gate structure within the gate cavity 52 and a second gate structure within each gap 62.

In each gate cavity 52, the gate dielectric 72 is U-shaped having a bottommost portion in direct contact with an upper surface of the topmost semiconductor nanowire 60 and vertical portions that are located on exposed sidewalls of the first spacers 32. Within each gap 62, gate dielectric 72 surrounds gate conductor 74.

The gate dielectric 72 can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be formed.

The gate dielectric 72 can be formed by any deposition technique including, for example, CVD, PECVD, PVD, and sputtering, and atomic layer deposition (ALD). In one embodiment of the present application, the gate dielectric 72 can have a thickness in a range from 1 nm to 10 nm, although lesser and greater thicknesses can also be employed.

After providing the gate dielectric 72, the gate conductor 74 can be formed atop the gate dielectric 72 and filling the remaining space of each gate cavity 52 and each gap 62. The gate conductor 74 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate conductor 74 can be formed utilizing a deposition process including, for example, CVD, PECVD, PVD, sputtering, ALD and other like deposition processes. When a metal silicide is formed, a conventional silicidation process is employed.

FIGS. 12A-12D illustrate a semiconductor structure of the present application that has reduced capacitance. The structure includes at least one stacked semiconductor nanowire array 70 suspended above a surface of a semiconductor substrate 10, wherein the at least one stacked semiconductor nanowire array 70 includes a plurality of vertically spaced apart semiconductor nanowires 60. The structure also includes a first gate structure within gate cavity 52 and located above a topmost vertically spaced apart semiconductor nanowires 60 of the at least one stacked semiconductor nanowire array 70. A dielectric spacer (i.e. first gate spacer 32) is present on each sidewall surface of the first gate structure. The structure further includes a second gate structure within each gap 62 and located beneath each vertically spaced apart semiconductor nanowire 60 of the at least one stacked semiconductor nanowire array 70. The second gate structure is laterally surrounded by a tunnel spacer 34'.

The structure also includes a source region 42S and a drain region laterally contacting each semiconductor nanowires 60 of the at least one stacked semiconductor nanowire array 70 and each tunnel spacer 34'. The structure further includes an ILD layer 50 located above the source region 34S and the drain region 34D and laterally surrounding the dielectric spacer (i.e., first spacer 26). The upper surface of the ILD layer 50 located above the source region 42S and the drain region 42D is coplanar with an upper surface of the first gate structure.

In the present application, the tunnel spacer 34' separates the second gate structure from each of the source region 42D and the drain region 42S, thus effectively reducing gate-to-source/drain parasitic capacitance. In the present application, the dielectric spacer (i.e. first gate spacer 32) and the second gate spacer 34 from which the tunnel spacer 34' is derived are simultaneously formed in a single step. This reduces fabrication complexity and leads to significantly reduction in fabrication cost.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:

forming at least one multilayered stacked semiconductor material structure on a semiconductor substrate, wherein the at least one multilayered stacked semiconductor material structure comprises alternating layers of a sacrificial semiconductor material and a semiconductor nanowire template material, the sacrificial semiconductor material is a different semiconductor material than the semiconductor nanowire template material;

forming at least one sacrificial gate material structure straddling a portion of the at least one multilayered stacked semiconductor structure;

removing portions of each layer of sacrificial semiconductor material that are not covered by the at least one sacrificial gate material structure;

simultaneously forming a first spacer on each sidewall of the at least one sacrificial gate material structure and a second spacer within an area previously occupied by each exposed portion of each layer of sacrificial semiconductor material;

removing portions of each layer of semiconductor nanowire template material and each second spacer that are not covered by the at least one sacrificial gate structure and each first gate spacer;

forming a source region and a drain region from exposed sidewall surfaces of a remaining portion of each layer of semiconductor nanowire template material and on opposite sides of the at least one sacrificial gate material structure;

suspending the remaining portion of each layer of semiconductor nanowire template material by removing the at least one sacrificial gate material structure and a remaining portion of each layer of sacrificial semiconductor material; and forming a first gate structure within an area previously occupied by the at least one sacrificial gate material structure and a second gate structure within an area previously occupied by each remaining portion of each layer of sacrificial semiconductor material.

2. The method of claim 1, wherein the forming the least one multilayered stacked semiconductor material structure comprises:

forming a semiconductor material stack comprising alternating layers of the sacrificial semiconductor material and the semiconductor nanowire template material on the semiconductor substrate, with the proviso that a topmost layer of the semiconductor material stack comprises the semiconductor nanowire template material; and patterning the semiconductor material stack by lithography and etching.

3. The method of claim 2, further comprising forming a base sacrificial semiconductor layer directly contacting an upper surface of the semiconductor substrate prior to the forming the semiconductor material stack, wherein the patterning the semiconductor material stack also patterns the base sacrificial semiconductor layer.

4. The method of claim 3, wherein the base sacrificial semiconductor layer comprises a silicon germanium alloy of a first germanium content, and each layer of the sacrificial semiconductor material comprises a silicon germanium alloy of a second germanium content less than the first germanium content.

5. The method of claim 3, wherein during said etching, trenches are formed within the semiconductor substrate on opposite sides of the at least one multilayered stacked semiconductor material structure, and wherein said trenches are filled with a trench dielectric material providing trench isolation structures.

6. The method of claim 5, after the simultaneously forming the first spacer on each sidewall of the at least one sacrificial gate material structure and the second spacer within the area previously occupied by each exposed portion of each layer of sacrificial semiconductor material, the method further comprising:

recessing exposed portions of the trench isolation structures that are not covered by the sacrificial gate material structure below a bottommost surface of a remaining portion of the base sacrificial semiconductor layer;

removing the remaining portion of the base sacrificial semiconductor layer; and forming an oxide on recessed surfaces of the trench isolation structure and within an area that is previously occupied by the remain portion of the base sacrificial semiconductor layer.

7. The method of claim 1, wherein the forming the at least one sacrificial gate material structure comprises:

depositing a blanket layer of sacrificial gate material on the at least one multilayered stacked semiconductor material structure and the semiconductor substrate; and patterning the blanket layer of sacrificial gate material by lithography and etching.

8. The method of claim 1, wherein the removing the portions of each layer of sacrificial semiconductor material that are not covered by the at least one sacrificial gate material structure is performed by a directional etch.

9. The method of claim 8, wherein the removing the portions of each layer of sacrificial semiconductor material that are not covered by the at least one sacrificial gate material structure is performed by a gas cluster ion beam (GCIB) etch.

10. The method of claim 8, wherein the removing the portions of each layer of sacrificial semiconductor material that are not covered by the at least one sacrificial gate material structure comprises:

damaging the exposed portions of each layer of sacrificial semiconductor material that are not covered by the at least one sacrificial gate material structure by an ion implantation; and removing the damaged exposed portions of each layer of sacrificial semiconductor material.

11. The method of claim 1, wherein the simultaneously forming the first spacer on each sidewall of the at least one sacrificial gate material structure and the second spacer within the area previously occupied by each exposed portion of each layer of sacrificial semiconductor material comprises:

depositing a spacer material on exposed surfaces of the at least one sacrificial gate material structure and the semiconductor substrate, and within the area previously occupied by each exposed portion of each layer of sacrificial semiconductor material; and remove the spacer materials from top surfaces of the at least one sacrificial gate material structure and the semiconductor substrate.

12. The method of claim 1, wherein the forming the source region and the drain region from the exposed sidewall surfaces of the remaining portion of each layer of semiconductor nanowire template material and on opposite sides of the at least one sacrificial gate material structure comprises depositing a doped semiconductor material utilizing an in-situ epitaxial deposition process.

13. The method of claim 12, further comprising diffusing a dopant in the doped semiconductor material into a portion of the remaining portion of each layer of semiconductor nanowire template material located beneath the first spacer.

14. The method of claim 1, wherein the forming the source region and the drain region from the exposed sidewall surfaces of the remaining portion of each layer of semiconductor nanowire template material and on opposite sides of the at least one sacrificial gate material structure comprises:

depositing a non-doped semiconductor material by epitaxial growth; and subjecting the non-doped semiconductor material to ion implantation or gas phase doping.

15. The method of claim 14, further comprising diffusing a dopant in the doped semiconductor material into a portion of the remaining portion of each layer of semiconductor nanowire template material underlying the first spacer.

16. The method of claim 1, wherein the first gate structure comprises a U-shaped gate dielectric having a bottommost portion in direct contact with an upper surface of a topmost layer of a suspended semiconductor material and a gate conductor located on the U-shaped gate dielectric.

17. The method of claim 16, wherein each second gate structure comprises a gate dielectric that surrounds a gate conductor.

18. The method of claim 16, wherein a sidewall portion of the gate dielectric of each second gate structure contacts a sidewall surface of a remaining portion of each second spacer.

19. The method of claim 1, further comprising forming an interlevel dielectric (ILD) layer atop the source region and the drain region prior to the removing the at least one sacrificial gate material structure, wherein the ILD layer laterally surrounds the first spacer.

20. The method of claim 19, wherein an upper surface of the ILD layer is coplanar with an upper surface of the first gate structure.

* * * * *